United States Patent
Reynolds

(10) Patent No.: US 7,521,942 B2
(45) Date of Patent: *Apr. 21, 2009

(54) METHODS AND SYSTEMS FOR GUARDING A CHARGE TRANSFER CAPACITANCE SENSOR FOR PROXIMITY DETECTION

(75) Inventor: Joseph Kurth Reynolds, Sunnyvale, CA (US)

(73) Assignee: Synaptics, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/926,411

(22) Filed: Oct. 29, 2007

(65) Prior Publication Data

US 2008/0042661 A1 Feb. 21, 2008

Related U.S. Application Data

(63) Continuation of application No. 11/833,828, filed on Aug. 3, 2007, now Pat. No. 7,417,441, which is a continuation of application No. 11/445,856, filed on Jun. 3, 2006, now Pat. No. 7,262,609.

(60) Provisional application No. 60/687,012, filed on Jun. 3, 2005, provisional application No. 60/687,148, filed on Jun. 3, 2005, provisional application No. 60/687,167, filed on Jun. 3, 2005, provisional application No. 60/687,039, filed on Jun. 3, 2005, provisional application No. 60/687,037, filed on Jun. 3, 2005, provisional application No. 60/774,843, filed on Feb. 16, 2006.

(51) Int. Cl.
*G01R 27/26* (2006.01)
(52) U.S. Cl. .................... 324/688; 324/683
(58) Field of Classification Search ............... 324/658, 324/678, 688, 683
See application file for complete search history.

(56) References Cited

U.S. PATENT DOCUMENTS 3,898,425 A 8/1975 Crandell et al.

(Continued)

FOREIGN PATENT DOCUMENTS

DE 3413849 8/1985

(Continued)

OTHER PUBLICATIONS

Touch Sensor IC(B6TS). Omron Corporation [retrieved on Aug. 14, 2006]. Retrieved from Internet: <URL:www.omron.co.jp/ecb/products/touch/pdf/en-keisoku.pdf>.

(Continued)

*Primary Examiner*—Vincent Q Nguyen
(74) *Attorney, Agent, or Firm*—Ingrassia, Fisher & Lorenz, P.C.

(57) ABSTRACT

Methods, systems and devices are described for determining a measurable capacitance for proximity detection in a sensor having a plurality of sensing electrodes and at least one guarding electrode. A charge transfer process is executed for at least two executions. The charge transfer process includes applying a pre-determined voltage to at least one of the plurality of sensing electrodes using a first switch, applying a first guard voltage to the at least one guarding electrode using a second switch, sharing charge between the at least one of the plurality of sensing electrodes and a filter capacitance, and applying a second guard voltage different from the first guard voltage to the at least one guarding electrode. A voltage is measured on the filter capacitance for a number of measurements equal to at least one to produce at least one result to determine the measurable capacitance for proximity detection.

25 Claims, 14 Drawing Sheets

U.S. PATENT DOCUMENTS

| | | | |
|---|---|---|---|
| 4,459,541 | A | 7/1984 | Fielden et al. |
| 5,012,124 | A | 4/1991 | Hollaway |
| 5,305,017 | A | 4/1994 | Gerpheide |
| 5,451,940 | A | 9/1995 | Schneider et al. |
| 5,543,591 | A | 8/1996 | Gillespie et al. |
| 5,659,254 | A | 8/1997 | Matsumoto et al. |
| 5,730,165 | A | 3/1998 | Philipp |
| 5,973,417 | A | 10/1999 | Goetz et al. |
| 6,323,846 | B1 | 11/2001 | Westerman et al. |
| 6,452,514 | B1 | 9/2002 | Philipp |
| 6,466,036 | B1 | 10/2002 | Philipp |
| 6,536,200 | B1 | 3/2003 | Schwartz |
| 6,593,755 | B1 | 7/2003 | Rosengren |
| 7,262,609 | B2 * | 8/2007 | Reynolds .................... 324/678 |
| 7,417,441 | B2 * | 8/2008 | Reynolds .................... 324/678 |
| 2003/0090277 | A1 | 5/2003 | Lechner et al. |
| 2004/0104826 | A1 | 6/2004 | Philipp |
| 2005/0068712 | A1 | 3/2005 | Schulz et al. |
| 2005/0099188 | A1 | 5/2005 | Baxter |

FOREIGN PATENT DOCUMENTS

| | | |
|---|---|---|
| EP | 1521090 | 5/2005 |
| EP | 1593988 | 11/2005 |
| FR | 2829317 | 3/2003 |
| JP | 3237594 | 10/1991 |
| WO | 2004059343 A1 | 7/2004 |
| WO | 2004066498 A1 | 8/2004 |
| WO | 2005031375 | 4/2005 |

OTHER PUBLICATIONS

Phillip, Hal; Fingering a Problem; New Electronics; Jan. 24, 2006; pp. 51-52; Retrieved from Internet: <URL:www.newelectronics.co.uk/articles/5676/fingering-a-problem.pdf>.

Cichocki, Andrzej et al.; A Switched Capacitor Interface for Capcaitive Sensors Based on Relaxation Oscillators; IEEE; Oct. 1990; pp. 797-799; vol. 39 No. 5.

Huang, S.M. et al.; Electronic Transducers for Industrial Measurement of Low Value Capacitances; J. Phys. E.: Sci. Instrum. 21; 1988; pp. 242-250, no month's available.

Phillip, H.; Charge Transfer Sensing: Spread Spectrum Sensor Technology Blazes New Applications; Retrieved from Internet: <URL:www.qprox.com/background/white_paper.php, Feb. 29, 2008 (Filing IDS date).

Toth, F.; Design Method. for Low-Cost, High-Perf. Cap. Sensors; Delft Univ. of Tech.;1997; Retrieved from Internet: <URL: www.exalondelft.nl/download/CapacitiveSensors.PDF>, no month's available.

Yamada, M. et al.; A Switched-Capacitor Interface for Capacitive Pressure Sensors; IEEE; Feb. 1992; pp. 81-86; vol. 31, No. 1.

Johns, D.A.; Analog Integrated Circuit Design; 1997; pp. 542, 543; John Wiley & Sons, no month's available.

Banks; Low Cost, Low Speed A/D Conversion for Embedded Systems; Byte Craft Limited (retrieved on Jul. 25, 2006); Retrieved from Internet: <URL: www.bytecraft.com/addaconv.html>.

Cao, Y. et al.; High-Accuracy Circuits for On-Chip Capacitance Ratio Testing or Sensor Readout; IEEE Transactions; Sep. 1994; pp. 637-639; vol. 41, No. 9.

Josefsson, O.; Ask the Applications Engineer: Using Sigma-Delta Converters—Part 1; Analog Dialogue 30th Anniversary Reader Bonus; 1997; pp. 29-33, no month's available.

Norsworthy, S.; Effective Dithering of Sigma-Delta Modulators; AT&T Bell Laboratories; IEEE; 1992; pp. 1304-1307, no month's available.

Martin, K.; A Voltage-Controlled Switch Capacitor Relaxation Oscillator; IEEE Journ. of Solid-State Circuits; Aug. 1981, pp. 412-414; vol. SC-16, No. 4.

Seguine, D.; Capacitive Key Scan; Cypress MicroSystems; Oct. 2004; version 4.1.

Seguine, D.; Capacitive Switch Scan; Cypress MicroSystems; Apr. 2005; version 4.2.

Quantum Research Group, "Secrets of a Successful QTouch™ Design", Quantum Research Application Note AN-KD02, Rev. 1.03, Oct. 2005, pp. 1-11.

Kremin, Victor et al., "Capacitance Sensing—Waterproof Capacitance Sensing—AN2398", Cypress Perform, Document No. 001-14501 Rev., Dec. 8, 2006, pp. 1-11.

* cited by examiner

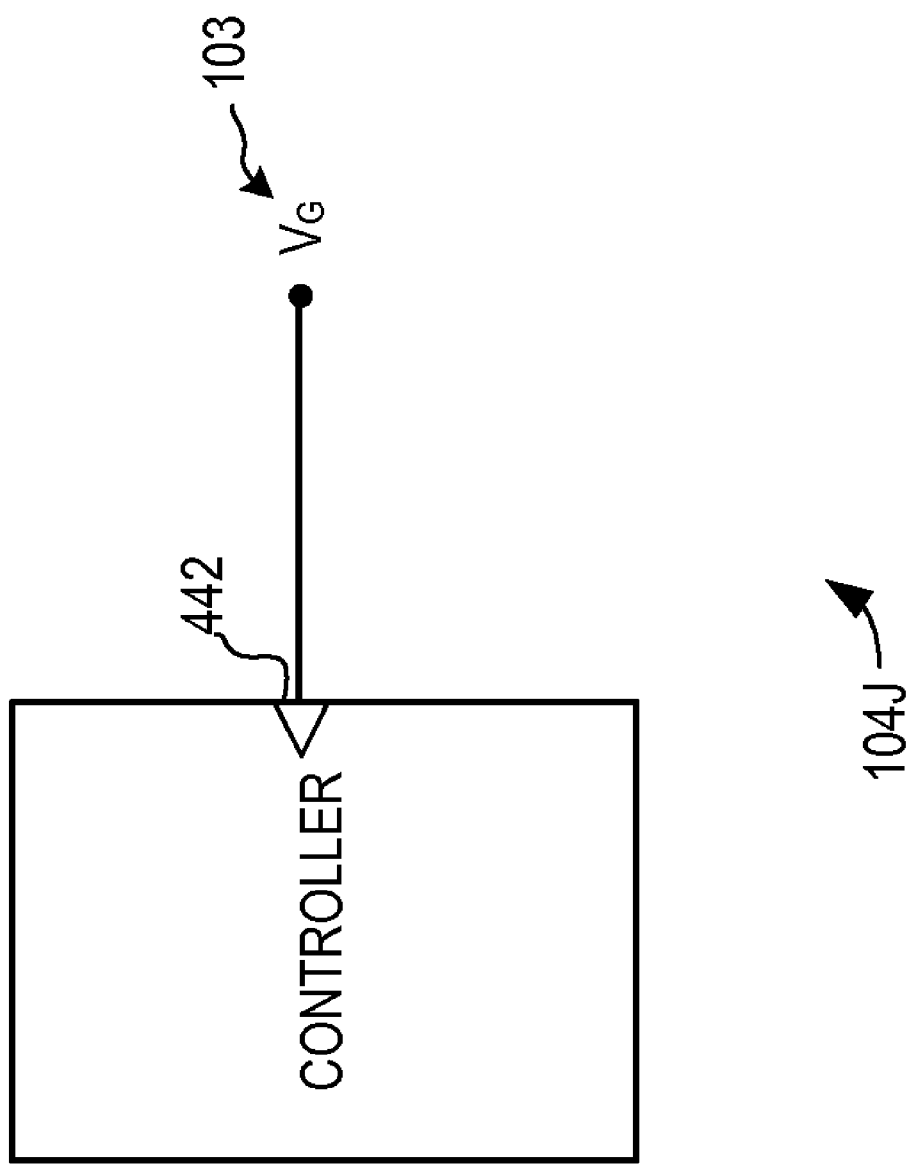

METHODS AND SYSTEMS FOR GUARDING A CHARGE TRANSFER CAPACITANCE SENSOR FOR PROXIMITY DETECTION

PRIORITY DATA

This application is a continuation application of U.S. patent application Ser. No. 11/833,828, filed Aug. 3, 2007 now U.S. Pat. No. 7,417,441, which is a continuation application of U.S. patent application Ser. No. 11/445,856, which was filed on Jun. 3, 2006, which issued on Aug. 28, 2007, as U.S. Pat. No. 7,262,609, which claims priority to U.S. Provisional Patent Application Ser. Nos. 60/687,012; 60/687,148; 60/687,167; 60/687,039; and 60/687,037, which were filed on Jun. 3, 2005 and Ser. No. 60/774,843 which was filed on Feb. 16, 2006, and are incorporated herein by reference.

TECHNICAL FIELD

The present invention generally relates to capacitance sensing, and more particularly relates to devices, systems and methods capable of detecting a measurable capacitance using switched charge transfer techniques.

BACKGROUND

Capacitance sensors/sensing systems that respond to charge, current, or voltage can be used to detect position or proximity (or motion or presence or any similar information), and are commonly used as input devices for computers, personal digital assistants (PDAs), media players and recorders, video game players, consumer electronics, cellular phones, payphones, point-of-sale terminals, automatic teller machines, kiosks, and the like. Capacitive sensing techniques are used in applications such as user input buttons, slide controls, scroll rings, scroll strips, and other types of inputs and controls. One type of capacitance sensor used in such applications is the button-type sensor, which can be used to provide information about the proximity or presence of an input. Another type of capacitance sensor used in such applications is the touchpad-type sensor, which can be used to provide information about an input such as the position, motion, and/or similar information along one axis (1-D sensor), two axes (2-D sensor), or more axes. Both the button-type and touchpad-type sensors can also optionally be configured to provide additional information such as some indication of the force, duration, or amount of capacitive coupling associated with the input. Examples of 1-D and 2-D touchpad-type sensor based on capacitive sensing technologies are described in United States Published Application 2004/0252109 A1 to Trent et al. and U.S. Pat. No. 5,880,411, which issued to Gillespie et al. on Mar. 9, 1999. Such 1-D and 2-D sensors can be readily found, for example, in input devices of electronic systems including handheld and notebook-type computers.

A user generally operates a capacitive input device by placing or moving one or more fingers, styli, and/or objects, near the input device an in a sensing region of one or more sensors located on or in the input device. This creates a capacitive effect upon a carrier signal applied to the sensing region that can be detected and correlated to positional information (such as the position(s), proximity, motion(s), and/or similar information) of the stimulus/stimuli with respect to the sensing region. This positional information can in turn be used to select, move, scroll, or manipulate any combination of text, graphics, cursors, highlighters, and/or any other indicator on a display screen. This positional information can also be used to enable the user to interact with an interface, such as to control volume, to adjust brightness, or to achieve any other purpose.

Although capacitance sensors have been widely adopted, sensor designers continue to look for ways to improve the sensors' functionality and effectiveness. In particular, engineers continually strive to reduce the effects of spurious noise on such sensors. Many capacitive sensors, for example, currently include ground planes or other structures that shield the sensing regions from external and internal noise signals. While ground planes and other types of shields held at a roughly constant voltage can effectively prevent some spurious signals from interfering with sensor operation, they can also reduce sensor resolution or increase parasitic effects, such as by increasing parasitic capacitance. Therefore, the performance of such devices is by no means ideal.

Accordingly, it is desirable to provide systems and methods for quickly, effectively and efficiently detecting a measurable capacitance while preventing at least some of the adverse effects that can result from spurious noise signals and/or enhance resolution. Moreover, it is desirable to create a scheme that can be implemented using readily available components, such as standard ICs, microcontrollers, and passive components. Other desirable features and characteristics will become apparent from the subsequent detailed description and the appended claims, taken in conjunction with the accompanying drawings and the foregoing technical field and background.

BRIEF SUMMARY

Methods, systems and devices are described for determining a measurable capacitance for proximity detection in a sensor having a plurality of sensing electrodes and at least one guarding electrode. A charge transfer process is executed for at least two executions. The charge transfer process includes applying a pre-determined voltage to at least one of the plurality of sensing electrodes using a first switch, applying a first guard voltage to the at least one guarding electrode using a second switch, sharing charge between the at least one of the plurality of sensing electrodes and a filter capacitance, and applying a second guard voltage different from the first guard voltage to the at least one guarding electrode. A voltage is measured on the filter capacitance for a number of measurements equal to at least one to produce at least one result to determine the measurable capacitance for proximity detection.

Using the techniques described herein, a guarded capacitance detection scheme may be conveniently implemented using readily available components, and can be particularly useful in sensing the position of a finger, stylus or other object with respect to a capacitive sensor implementing button, slider, cursor control, or user interface navigation functions, or any other functions.

BRIEF DESCRIPTION OF THE DRAWINGS

Various aspects of the present invention will hereinafter be described in conjunction with the following drawing figures, wherein like numerals denote like elements, and:

FIGS. 4A-E are more detailed block diagrams of exemplary circuits that could be used to generate guard voltages of a guard signal.

DETAILED DESCRIPTION

Figure 1A:
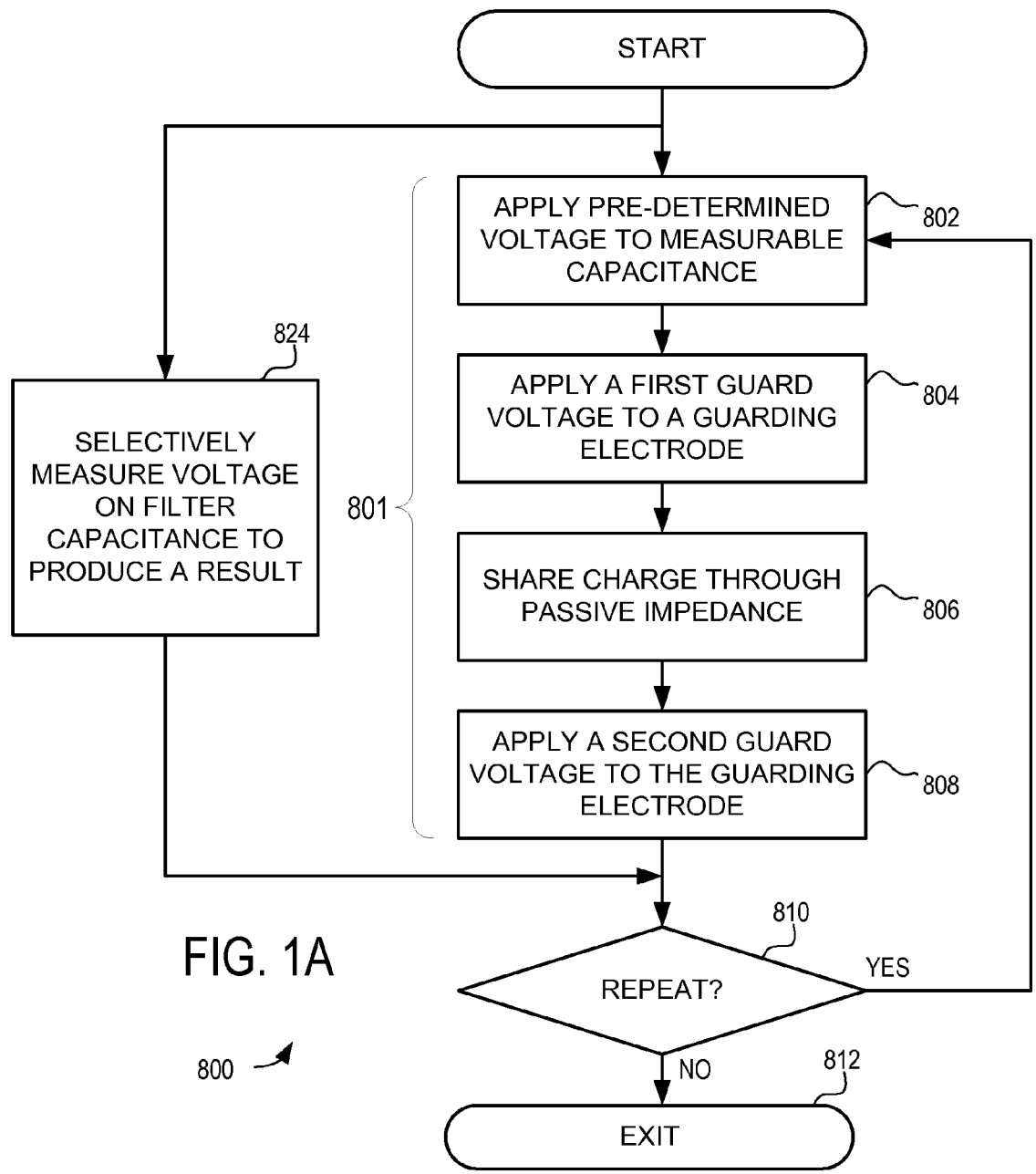
FIG. 1A is a flowchart of an exemplary technique for detecting capacitance using switched charge transfer techniques with guarding.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, a capacitance detection and/or measurement circuit can be readily formulated using two or more switches. Further, a guard signal with two or more guarding voltages can be applied to a guarding electrode using one or more additional switches and one or more passive electrical networks (which can be a simple wire or a complex network); this can be used to shield the sensor from undesired electrical coupling, thereby improving sensor performance. In a typical implementation, a charge transfer process is executed for two or more iterations. In the charge transfer process, a pre-determined voltage is applied to a measurable capacitance using one or more of the switches and a first guarding voltage is applied to a guarding electrode with a second switch, the measurable capacitance then shares charge with a filter capacitance in the passive network and a second guarding voltage is applied to the guarding electrode. With such a charge transfer process, a plurality of applications of the pre-determined voltage and the associated sharings of charge influence the voltage on the filter capacitance. The voltage on the filter capacitance can be the voltage at a node of the circuit that indicates the voltage across the filter capacitance. The voltage on the filter capacitance can also be the voltage across the filter capacitance itself. The charge transfer process thus can be considered to roughly "integrate" charge onto the filter capacitance over multiple executions such that the "output" voltage of the filter capacitance is filtered. The charge transfer process may be done using only switches and passive elements such as resistances, capacitances, and/or inductances. After one or more iterations of the charge transfer process, the voltage on the filter capacitance (which is representative of the charge on the filter capacitance) is measured. One or more measurings can be used to produce one or more results and to determine the measurable capacitance. The measuring of the voltage on the filter capacitance can be as simple as a comparison of the voltage on the filter capacitance with a threshold voltage, or be as complex as a multi-step analog-to-digital conversion extracting charge from the filter capacitance and measuring the voltage multiple times. Using these techniques, capacitive position sensors capable of detecting the presence or proximity of a finger, stylus, or other object can be readily formulated. Additionally, various embodiments of the guard described herein can be readily implemented using only conventional switching mechanisms (e.g. signal pins of a control device) and passive components (e.g. one or more capacitors, resistors, inductors and/or the like), without the need for additional active electronics that would add cost and complexity. The various guarding techniques described herein can use similar components and methods as charge transfer sensing techniques. This, coupled with the ease of multi-channel integration, provide for highly efficient implementation of the guard. As a result, the various guarding schemes (and sensing schemes if desired) described herein may be conveniently yet reliably implemented in a variety of environments using readily-available and reasonably-priced components, as described more fully below.

With reference now to FIG. 1A, an exemplary technique 800 for detecting a measurable capacitance that provides guarding to shield the measurable capacitance from undesired electrical coupling is illustrated. The method 800 uses switched charge transfer to detect measurable capacitances, and is particularly applicable to the detection of capacitances for object position detection. The technique suitably includes the broad steps of performing a charge transfer process with voltage guarding (step 801) for two or more times (as repeated by step 810) and selectively measuring a voltage on the filter capacitance to produce a result (step 824). The charge transfer process 801 includes applying a pre-determined voltage to the measurable capacitance (step 802). Then, a first guard voltage is applied to a guarding electrode (step 804). The first guard voltage is preferably provided before the applying of the pre-determined voltage to the measurable capacitance ceases. Then, charge is shared by the measurable capacitance and a filter capacitance (step 806). "Sharing" charge in this context can refer to actively switching to couple the measurable capacitance and the filter capacitance, actively switching elsewhere in the system, otherwise directing the transfer of charge, or passively allowing the charge to transfer through impedance through quiescence or other inaction. Then, a second guard voltage is applied to the guarding electrode (step 808). The second guard voltage is different from the first guard voltage, and is preferably applied to the guarding electrode before the sharing of charge substantially ends. The charge transfer process repeats at least once (step 810) for at least two performances of the charge transfer process total, and may repeat many more times. The charge transfer process can repeat until the voltage on filter capacitance exceeds a threshold voltage, until the process 801 has executed for a pre-determined number of times, and/or according to any other scheme. Each time the charge transfer process executes, the first and second guard voltages are provided to shield from undesirable electrical coupling.

Measurement of the voltage on the filter capacitance to produce a result (step 824) can take place at any time, including before, after, and during the charge transfer process. In addition, none, one, or multiple measurements of the voltage on the filter capacitance 824 can be taken for each repetition such that the number of measurement results to the number of charge transfer processes performed can be of any ratio, including one-to-many, one-to-one, and many-to-one. Preferably the voltage on filter capacitance is measured when the voltage on the filter capacitance is substantially constant. One or more of the measurement results is/are used in a determination of the value of the measurable capacitance. The value of the measurable capacitance may take place according to any technique. In various embodiments, the determination is made based upon the measurement(s) of the voltage on the filter capacitance (which is indicative of the charge on the filter capacitance), the values of known components in the system (e.g. the filter capacitance), as well as the number of times that the charge transfer process 801 was performed. As noted just previously, the particular number of times that process 801 is performed may be determined according to a pre-determined value, according to the voltage across the filter capacitance crossing a threshold voltage, or any other factor as appropriate.

Steps 802-808 and steps 824 can be repeated as needed (step 810). For example, in a proximity sensor implementation, the measurable capacitance corresponding to each sensing electrode would typically be determined many times per second. This provides the ability to determine the proximity of objects near the sensor, as well as changes to that proximity, and thus facilitates use of the process in a device for user input. Thus, the process can be repeated at a high rate for each sensing electrode each second to enable many determinations of the measurable capacitance per second.

Process 800 may be executed in any manner. In various embodiments, process 800 is executed by software or firmware residing in a digital memory, such as a memory located within or in communication with a controller, or any other digital storage medium (e.g. optical or magnetic disk, modulated signal transmitted on a carrier wave, and/or the like). Process 800 and its various equivalents and derivatives discussed above can also be executed with any type of programmed circuitry or other logic as appropriate.

The steps of applying first and second guard voltages can be implemented with a variety of different techniques and devices. For example, the guard voltages can be provided using switching mechanisms and passive components (e.g. one or more capacitors, resistors, inductors, and/or the like), without the need for additional active electronics that would add cost and complexity (although such active electronics, including DACs and followers, can be used to provide the proper guard voltages at low impedance).

Figure 1B:
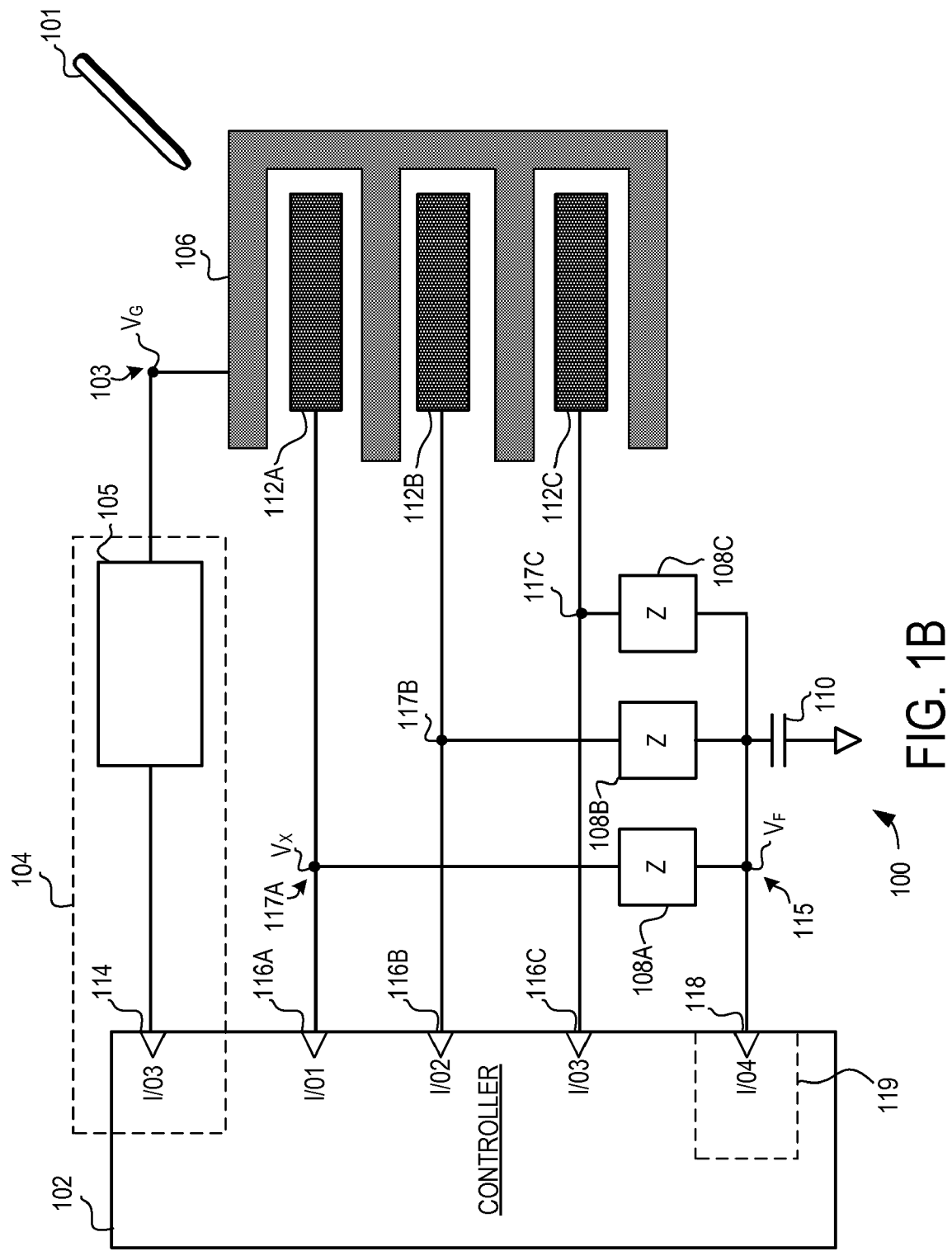
FIG. 1B is a block diagram of an exemplary capacitive proximity sensor that includes guard circuitry.

Now with initial reference to FIG. 1B, an exemplary capacitance sensor 100 suitably includes three sensing electrodes 112A-C and one guarding electrode 106. The sensing electrodes 112A-C are directly coupled to switches 116A-C, respectively. The sensing electrodes 112A-C are also directly coupled with a filter capacitance (also "integrating capacitance" or "integrating filter") 110 ($C_F$) through passive impedances 108A-C, respectively. The filter capacitance 110 is also shown directly coupled to a switch 118. The guarding electrode 106 is coupled to a guarding voltage generating circuit 104 that includes passive guarding network 105 and one or more switch(es) 114. Guarding voltage generating circuit 104 provides an appropriate guard signal ($V_G$) 103. Also shown in FIG. 1B is stimulus 101 that is not part of capacitance sensor 100 and is detected by capacitance sensor 100. Stimulus 101 can be one or more fingers, styli, objects, and the like, even though one stylus is shown in FIG. 1B.

Although a specific configuration of sensor 100 is shown in FIG. 1B, it is understood that many other configurations are possible. Other embodiments of capacitance sensor 100 may include any number of sensing electrodes, guarding electrode, filter capacitances, passive impedances, switches, guarding voltage generating circuits, and controllers as appropriate for the sensor. They can also be in any ratio appropriate for the sensor; for example, the sensing electrodes may also be coupled to filter capacitance(s) with or without passive impedances in a many-to-one, one-to-many, one-to-one, or many-to-many configuration as allowable by the sensing scheme used. It should be noted that while FIG. 1B shows switch(es) 114, 116A-C, and 118 all implemented using I/Os of a controller 102, that this is just one example embodiment, and that these and other switches could be implemented with a variety of different devices including discrete switches distinct from any controller. As further examples, the sensor may use a passive guarding network that consists of a single wire or a more complex circuit network, or the sensor may also provide the guarding signal using a single switch or multiple switches (which may involve using one or many I/Os of a controller, a multiplexer, a digital-to-analog converter (DAC), etc., since each multiplexer or DAC includes multiple switches). A switch can be used in a multitude of ways to provide the guard signal, including closing the switch, opening the switch, or actuating it in some other manner (e.g. PWM and pulse coded modulating). Therefore, one can apply a voltage by closing a switch as well as by opening a switch, depending on how the circuit is laid out. Additional analog components may also be used (e.g. to buffer the output of the passive guarding network 105).

The sensing electrodes 112A-C provide the measurable capacitances whose values are indicative of the changes in the electric field associated with stimulus 101. Each of the measurable capacitances represents the effective capacitance of the associated sensing electrode(s) 112A-C detectable by the capacitance sensor 100. In an "absolute capacitance" detecting scheme, the measurable capacitance represents the total effective capacitance from a sensing electrode to the local ground of the system. In a "trans-capacitance" detection scheme, the measurable capacitance represents the total effective capacitance between the sensing electrode and one or more driving electrodes. Thus, the total effective capacitance can be quite complex, involving capacitances, resistances, and inductances in series and in parallel as defined by the sensor design and the operating environment. However, in many cases the measurable capacitance from the input can be modeled simply as a small variable capacitance in parallel with a fixed background capacitance.

To determine the measurable capacitances, appropriate voltage signals are applied to the various electrodes 106, 112A-C using any number of switches 114, 116A-C. In various embodiments, the operation of switches 114, 116A-C is controlled by a controller 102 (which can be a microprocessor or any other controller). By applying proper signals using switches 116A-C, the measurable capacitances exhibited by electrodes 112A-C (respectively) can be determined. Moreover, by applying proper signals using switch(es) 114, suitable guarding voltages can be generated to produce a guard signal 103 that is placed on guarding electrode 106 to shield the measurable capacitances from undesired effects of noise and other spurious signals during operation of sensor 100.

Guarding electrode 106 is any structure capable of exhibiting applied guarding voltages comprising guard signal 103 to prevent undesired capacitive coupling with one or more measurable capacitances. Although FIG. 1B shows guarding electrode 106 with a "comb"-type appearance, this appearance is shown for convenience of explanation, and guarding electrode 106 may exhibit any other form or shape, in any number of equivalent embodiments as applicable for the design of sensor 100. For example, the sensing electrodes 112A-C may be laid out in some other pattern or have some other shape, and the shape of guarding electrode 106 can be laid out as appropriate. Guarding electrode 106 can also be routed around all or portions of a perimeter of a set of sensing electrodes to shield the set at least partially from the environment. Guarding electrode 106 can be routed behind at least a portion of the sensing electrodes to shield them from any electronics behind the sensing electrodes. Guarding electrode 106 can also be routed between sensing electrodes to shield them from each other. The guarding electrode does not need to extend the full length between sensing electrodes or cover the full sensing electrodes to offer a useful level of guarding. For example, guarding electrode 106 can parallel only portions of the sensing electrodes 112A-C, or interleave some or all of the sensing electrodes 112A-C. In addition, if a "trans-capacitance" detection scheme is used, guarding electrode 106 may be routed around any areas where guarding electrode 106 may interfere with the capacitive coupling between the sensing electrodes 112A-C and any driving electrode(s), such as some regions between the sensing electrodes 112A-C and the driving electrode(s). As explained below, capacitive coupling between guarding electrode 106 and measurable capacitances can be controlled through application of appropriate guarding voltages via switch(es) 114.

In the exemplary embodiment shown in FIG. 1B, a filter capacitance 110 is provided by one or more capacitors (such as any number of discrete capacitors) to accept charge transferred from sensing electrodes 112A-C. Although the particular filter capacitance value selected will vary from embodiment to embodiment, the capacitance of each filter capacitance 110 will typically be much greater—perhaps by only one to two orders of magnitude but often several orders of magnitude greater—than the capacitance of the measurable capacitances. Filter capacitance 110 may be designed to be on the order of several nanofarads, for example, when expected values of measurable capacitances are on the order of several picofarads or so. Actual values of filter capacitance 110 may vary, however, depending upon the particular embodiment.

The concepts of capacitance sensing in conjunction with guarding can be applied across a wide array of sensor architectures 100, although a particular example is shown in FIG. 1B. In the exemplary embodiment shown in FIG. 1B, each sensing electrode 112A-C, and thus each associated measurable capacitance, is coupled to a common filter capacitance 110 through an associated passive impedance 108A-C. Alternate embodiments may use multiple filter capacitances and/or passive impedances for each measurable capacitance as appropriate. Alternate embodiments may also share a passive impedance and/or a filter capacitance between multiple measurable capacitances. When included, passive impedances 108A-C are typically provided by one or more non-active electronic components, such as any type of diodes, capacitors, inductors, resistors, and/or the like. Passive impedances 108A-C are each generally designed to have an impedance that is large enough to prevent significant current bleeding into filter capacitance 110 during charging of measurable capacitance, as described more fully below. In various embodiments, impedances 108A-C may be on the order of a hundred kilo-ohms or more, although other embodiments may utilize widely different impedance values. Again, however, passive impedances 108A-C need not be present in all embodiments where charge sharing is otherwise implemented.

Operation of sensor 100 suitably involves a charge transfer process and a measurement process facilitated by the use of one or more switches 116A-C, 118 while a guard signal 103 is applied using switch(es) 114. Again, although shown implemented using I/Os of controller 102, switches 114, 116A-C and/or 118 may be implemented with any type of discrete switches, multiplexers, field effect transistors and/or other switching constructs, to name just a few examples. Alternatively, any of switches 114, 116A-C, 118 can be implemented with internal logic/circuitry coupled to an output pin or input/output (I/O) pin of the controller 102, as shown in FIG. 1B. Such I/O pins, if used, can also provide input functionality and/or additional switches. For example, switch 118 can be implemented with I/O 119 that also connects to, or contains, input capability within controller 102. The input capability may be used in measuring the voltage on the filter capacitance 110 directly or indirectly, and might include a multiplexer, comparator, hysteretic thresholds, CMOS threshold, or analog-to-digital converter. Such I/O pins are typically capable of switchably applying one or more logic values and/or a "high impedance" or "open circuit" value by using internal switches coupled to power supply voltages. The logic values may be any appropriate voltages or other signals. For example, a logic "high" or "1" value could correspond to a "high" voltage (e.g. 5 volts), and a logic "low" or "0" value could correspond to a comparatively "low" voltage (e.g. local system ground, −5 volts or the like). The particular signals selected and applied can vary significantly from implementation to implementation depending on the particular controller 102, sensor configuration, and sensing scheme selected. For example, a current source, a pull-up resistance, or a digital-to-analog converter (DAC) also could be used to provide the proper voltages, and may be external or internal to controller 102.

One advantage of many embodiments is that a very versatile capacitance sensor 100 can be readily implemented using only passive components in conjunction with a controller 102 that is a conventional digital controller comprised of any combination of one or more microcontrollers, digital signal processors, microprocessors, programmable logic arrays, integrated circuits, other controller circuitry, and/or the like. A number of these controller products are readily available from various commercial sources including Microchip Technologies of Chandler, Ariz.; Freescale Semiconductor of Austin, Tex.; and Texas Instruments of Richardson, Tex., among others. Controller 102 can contain digital memory (e.g. static, dynamic or flash random access memory) that can be used to store data and instructions used to execute the various charge transfer processing routines for the various capacitance sensors contained herein. During operation of various embodiments, the only electrical actuation on the sensing electrodes 112A-C and their associated measurable capacitances that need take place during operation of sensor 100 involves manipulation of switches 114, 116A-C and 118; such manipulation may take place in response to configuration, software, firmware, or other instructions contained within controller 102.

The charge transfer process, which is typically repeated two or more times, suitably involves using a first switch to apply a pre-determined voltage (such as a power supply voltage, battery voltage, ground, or logic signal) to charge the applicable measurable capacitance(s), and then passively or actively allowing the applicable measurable capacitance(s) to share charge with any filter capacitance (e.g. 110) as appropriate. Passive sharing can be achieved by charge transfer through an impedance such as a resistance, and active sharing can be achieved by activating a switch that couples the applicable measurable capacitance(s) to the appropriate filter capacitance(s).

The pre-determined voltage is often a single convenient voltage, such as a power supply voltage, a battery voltage, a digital logic level, a resistance driven by a current source, a divided or amplified version of any of these voltages, and the like. The value of the pre-determined voltage is often known, and often remains constant; however, neither needs be the case so long as the pre-determined voltage remains ratiometric with the measurement of the voltage on the applicable filter capacitance (e.g. 110). For example, a capacitance sensing scheme can involve resetting the filter capacitance to a reset voltage, and also involve measuring a voltage on the filter capacitance by comparing the voltage (as relative to the reset voltage) on one side of the filter capacitance with a threshold voltage (also as relative to the reset voltage). With such a sensing scheme, the difference between the pre-determined voltage and the reset voltage, and the difference between the threshold voltage and the reset voltage, should remain roughly proportional to each other, on average over the executions of the charge transfer process leading to the determination of the measurable capacitance. Thus, the threshold used to measure the change in voltage on the filter capacitance will be proportional to the change in voltage on the filter capacitance due to the charge shared from the measurable capacitance to the filter capacitance during the executions of the charge transfer process for a determination of the measurable capacitance. In particular, where the pre-determined voltage is $V_{dd}$ and the reset voltage is GND, the threshold voltage can be ratiometric for a CMOS input threshold, for example (½)*($V_{dd}$–GND).

Figure 1C:
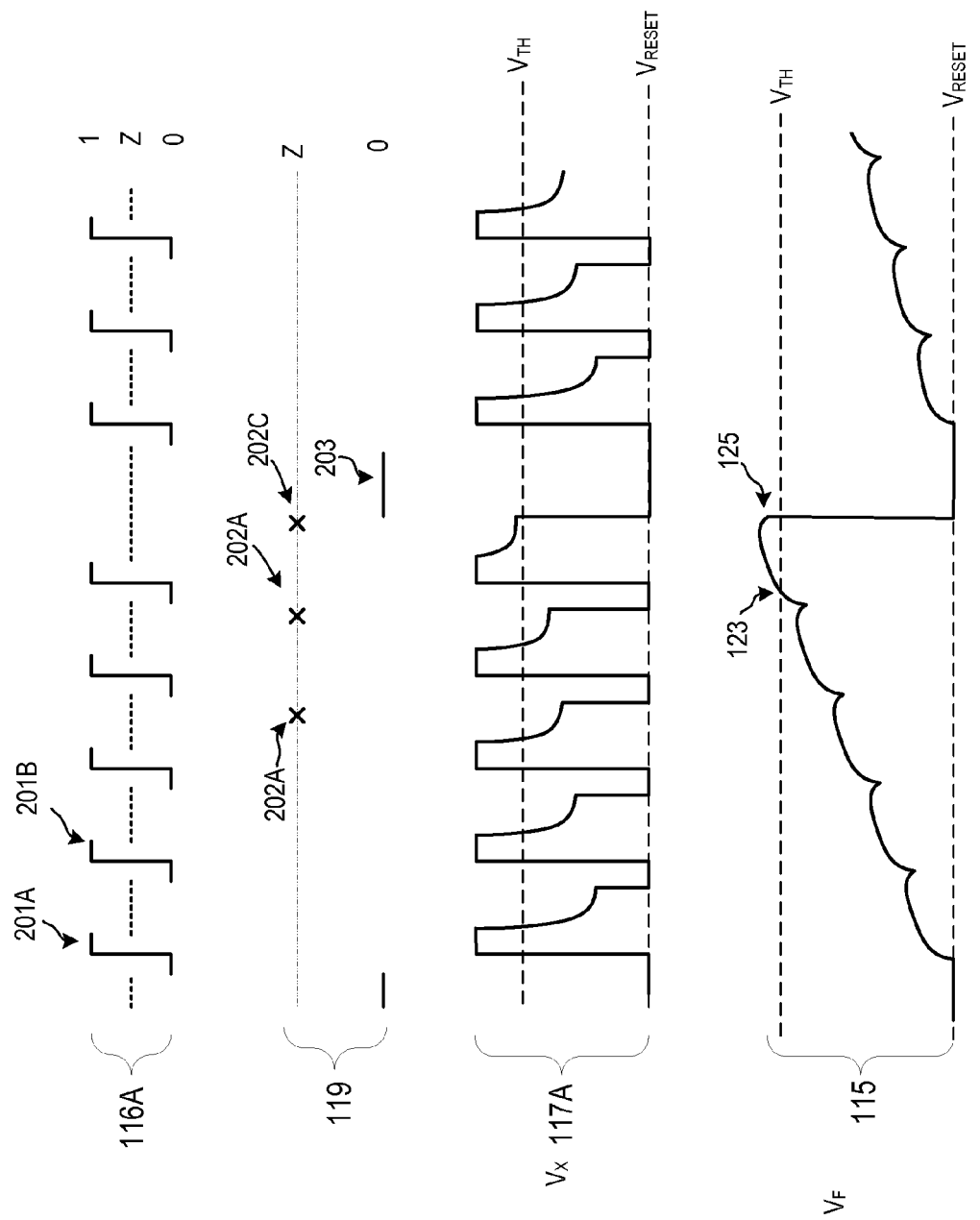
FIG. 1C is a timing diagram relating to an exemplary technique for operating the capacitive proximity sensor with guard circuitry of FIG. 1B.

The example shown in FIG. 1B can be operated in a manner as shown by FIG. 1C. In the embodiment shown by FIGS. 1B-C, each switch 116A-C applies a pre-determined voltage with "charging pulses" 201 that typically have relatively short periods in comparison to the RC time constants of impedances 108A-C with the filter capacitance 110, and preferably have relatively short periods in comparison to the RC time constants of impedances 108A-C with their associated measurable capacitances. This is so that the charge added to filter capacitance 110 during the charge transfer process comes mostly from the charge stored on the active measurable capacitance and shared with filter capacitance 110, and less from any flow of current through the associated impedance (e.g. 108A-C) during the applying of the pre-determined voltage. This helps to prevent excessive leakage of current through impedances 108A-C. Also shown in FIG. 1C, each charging pulse 201 additionally provides relatively brief durations of an "opposing" "discharging voltage" (a voltage that have a magnitude opposite that of the pre-determined voltage) before applying the pre-determined voltage. The discharging voltage can compensate for any current leaking through impedances 108A-C during the charge transfer process; it is an optional feature that is not required in all embodiments. More than one level of voltage can be used in the pre-determined voltage in an execution or between executions, and this is also true for the opposing voltage. However, in many cases the pre-determined voltage and the opposing voltage (if used) will have substantially constant voltages.

The following discussion describes the operation with one guarding electrode (e.g. 106), one measurable capacitance (e.g. associated with sensing electrodes 112A-C), one filter capacitance 110, and often one passive impedance (e.g. 108A-C). This is done for clarity of explanation, and it is understood that multiple measurable capacitances, passive impedances, and filter capacitances can be included in the system, and they can be operated in serially (at least partially or completely separate in time) or in parallel (at least partially or completely overlapping in time).

After applying the pre-determined voltage to the measurable capacitance, the measurable capacitance is allowed to share charge with filter capacitance. To allow measurable capacitance to share charge, no action may be required other than to stop applying the pre-determined voltage and pause for a time sufficient to allow charge to passively transfer. In various embodiments, the pause time may be relatively short (e.g. if the filter capacitance is connected directly to the measurable capacitance with a small resistance in series), or some delay time may occur (e.g. for charge to transfer through a larger resistance in series with the measurable capacitance, the filter capacitance, and reference voltage). In other embodiments, allowing charge to transfer may involve stopping the application of the pre-determined voltage and actively actuating one or more switches associated with a controller to couple the measurable capacitance and the filter capacitance, and/or taking other actions as appropriate. For example, charge sharing with the filter capacitance could occur in other embodiments using "sigma-delta" techniques; such as in a process whereby the filter capacitance is charged via a measurable capacitance and discharged by a "delta" capacitance (not shown), or vice versa. As another example, charge sharing with the filter capacitance could occur by actuating switches (not shown) that couple and decouple the measurable capacitance with the filter capacitance or that couple and decouple the filter capacitance with a power supply voltage. In such embodiments, impedances such as those shown as 108A-C shown in FIG. 1B may not be present, may be augmented by passive or active elements, and/or may be replaced by passive or active elements as appropriate.

A charge transfer process where sharing charge between the measurable capacitance and the filter capacitance occurs using one or more active components (e.g. by actively opening or closing a switch) clearly indicates the beginning and the end of a sharing period with these actuations of the active component(s). Similarly, a charge transfer process where the measurable capacitance is directly connected to one side of the filter capacitance, and the other side of the filter capacitance is coupled, by activating a switch, to a low impedance reference voltage, also clearly indicates the beginning and ending of a sharing period. In contrast, charge transfer processes that passively share charge have less clear denotations of the charge sharing periods. In the systems that passively share charge, the charge sharing period can be considered to begin when the applying of the pre-determined voltage ceases; the charge sharing period must end at or before a subsequent charging pulse begins (for a subsequent execution of the charge transfer process) and at or before a reset of the filter capacitance (if a reset is used and indicates an end a set of charge transfer processes). The sharing period may end before a subsequent charging pulse and before any reset because current flow effectively stops when the voltages are similar enough that negligible charge is shared between the measurable capacitance and the filter capacitance; this will be the case when sufficient time has passed while the measurable capacitance and filter capacitance are coupled to each other. However, even if the voltages do not substantially equalize before a subsequent charging pulse or reset signal, charge sharing still ends when the charging pulse or reset signal begins. This is because the applying of the charging pulse or reset signal dominates over any charge sharing between the measurable capacitance and the filter capacitance in a passive sharing system where the filter capacitance is always coupled to the measurable capacitance (such as in sensor 100 of FIG. 1B). The low impedance path of the charging pulse or reset signal means that any charge on the measurable capacitance that would be shared with the filter capacitance is negligible until the low impedance source is removed.

The measurement process may be performed at any point of the charge transfer process as appropriate for the sensor configuration and sensing scheme used, and the number of performances of the measurement process may be in any ratio with the performances of the charge transfer process as appropriate for the sensor configuration and sensing scheme used. For example, the measurement process may take place after the sharing of the charge between the measurable capacitance and the filter capacitance brings the voltage on the filter capacitance to be within some percentage point from an asymptote, or the measurement process may take place every time a charge transfer process is performed. Conversely, the measurement process may take place while the pre-determined voltage is applied (if the filter capacitance is properly prevented from charge sharing with the measurable capacitance at that time). The measurement process may take place only for a set number of repetitions of the charge transfer process, or only after a number of repetitions have already taken place. The measuring of the voltage on the filter capacitance can be as simple as a comparison of a voltage on the filter capacitance with a threshold voltage (such as in a "sigma-delta" scheme), or be as complex as a multi-step analog-to-digital conversion (such as when a known number of charge transfer processes are performed and then the voltage on the filter capacitance is read as a multi-bit value). Multiple thresholds can also be used, such as in an oscillator or other dual-slope sensing system where the voltage on the filter capacitance is driven between low and high thresholds, and in multi-bit ADCs where multiple thresholds are used to measure the voltage on the filter capacitance. One or more measurements can be taken, and stored if appropriate, to determine the measurable capacitance as applicable.

More detail about particular capacitance sensing schemes can be found in various literature, in U.S. Pat. Nos. 5,730,165, 6,466,036, and 6,323,846, as well as in U.S. patent applications entitled Methods and Systems for Detecting a Capacitance Using Switched Charge Transfer techniques, by David Ely et al, filed Jun. 3, 2006 and Methods and Systems for Detecting a Capacitance Using Sigma-Delta Measurement Techniques, by Kirk Hargreaves et al, filed Jun. 3, 2006. Again, the particular capacitance sensing technique and sensor architecture 100 may vary significantly in other embodiments.

A system without any shields or guards will be affected by the environment. Therefore, as discussed earlier, many capacitive sensors include ground planes or other structures that shield the sensing regions from external and internal noise signals. However, ground planes and other types of shields held at a roughly constant voltage are by no means ideal—they can increase the effects of parasitic capacitance (or other parasitic impedance and associated charge leakage) and reduce resolution or dynamic range. In contrast, a driven, low-impedance guard can provide similar shielding without significantly increasing the effect of parasitic capacitance or reducing resolution. This is done by reducing the charge transferred through any parasitic capacitances associated with any guarding electrode(s) onto any filter capacitance(s) during the course of executions of the charge transfer processes leading to the determination of the measurable capacitance(s). The voltages of the guard can be provided by using an output from a charge transfer process similar to the one to be guarded. This output can be provided as an input to a buffer (or other follower circuit) to guard multiple sensing channels with low impedance. Alternatively, these guard voltages can also be directly provided by using a guard-charge transfer process (one performed for guarding purposes) that inherently provides a low impedance guard signal such that no additional buffering is needed; this guard-charge transfer process could also be similar to the charge transfer process used for sensing, but that is not required.

The typical charge transfer sensing scheme will perform the charge transfer processes multiple times (and often hundreds of times or more) to generate the measurement(s) that are used for one determination of the measurable capacitance. This set of charge transfer processes that lead to the measurement(s) used for one determination varies between embodiments. As four examples, the set can be between a reset state and a final-threshold-state for systems that charge to threshold(s); the set can be between an initial state and a final-read-state for systems that perform a set number of charge transfer processes and read one or more multi-bit voltage output(s); the set can be between the low and high thresholds for dual slope or oscillator systems; the set can also be the sample length of a digital filter for sigma-delta systems. This set of charge transfer processes defines a set where the overall guarding effect is considered, or "the course of executions of the charge transfer processes leading to the determination of the measurable capacitance."

To reduce the net charge transferred through the parasitic capacitance associated with the guarding electrode onto the filter capacitance during the course of executions of the charge transfer processes leading to the determination of the measurable capacitance(s), a guard signal with proper guarding voltages can be applied. The applying of the pre-determined charging voltage to the measurable capacitance lasts for some duration of time, and before this duration ends, a first guarding voltage similar to this pre-determined voltage can be applied to the appropriate guarding electrode. Since the pre-determined voltage is typically fairly constant, the first guarding voltage can often be a single, roughly constant voltage. Then, before all the charge is shared (i.e., before charge sharing ends) between the measurable capacitance and associated filter capacitance, the guard signal applied to the guarding electrode may be changed to a second guarding voltage similar to the voltage on the associated filter capacitance. Again, although the singular is used in this discussion, there can be any number of guarding electrodes, measurable capacitances, impedances, filter capacitances, and the like involved.

In the embodiment shown in FIG. 1B, guarding electrode 106 is provided, over a low impedance path, with guarding voltages composing guard signal 103 that at least roughly approximate the voltages on the active electrode (e.g. 112A-C) during the sensing process. If a fairly constant pre-determined voltage is applied to charge the measurable capacitances, the guard signal 103 that is applied to the guarding electrode 106 before the applying of the pre-determined voltage is finished can comprise a single voltage similar to this pre-determined voltage. Then, before the charge transfer between the measurable capacitance with filter capacitance 110 ends (i.e. before the sharing period ends), the guard signal 103 applied to the guarding electrode 106 may be changed to a guarding voltage similar to the voltage on filter capacitance 110. If the guard signal 103 is changed to a second guarding voltage that is a substantially constant voltage during the charge sharing period and for multiple executions of the charge transfer process, it can be a voltage chosen to approximate the voltage on the filter capacitance 110. Approximations are appropriate when discrete voltages are used in guard signal 103, since the voltage on the filter capacitance 110 changes during sharing and between repetitions of the charge transfer process. For example, the guarding voltage of the guard signal 103 applied to guarding electrode 106 may be set to the pre-determined voltage during the charging of the measurable capacitance, and then changed from the pre-determined voltage to a voltage between an appropriate threshold voltage ($V_{TH}$) and an after-reset-voltage on the associated filter capacitance 110 to reduce the net transfer of charge. Any DC offset between the guarding electrode voltage and the sensing electrode voltage would not affect the usefulness of the guard for capacitive coupling, since similar voltage swing (i.e. similar change in voltage) is typically of greater concern than the actual voltage applied, in ensuring an effective guard.

The guarding voltages of guard signal ($V_G$) 103 may be generated in any manner. Even though the embodiment shown in FIGS. 1B-C describes guard signal 103 as being generated by an I/O that enables switch(es) 114 to apply power supply voltages, it is understood that many other embodiments are possible. For example, alternate sources for guard signal 103 may involve discrete switches, multiplexers, operational amplifiers (OP-AMPs), follower, or ADCs other than digital I/Os, utilize current and/or voltage sources, and may be separate from the controller implementing the charge transfer process. In addition, digital-to-analog converters, pulse-width modulators, and the like can also be used to generate the guard signals 103 in various equivalent embodiments. In addition, a wide range of voltages different from that used by the charge transfer process can be applied. For example, the voltage source for guard signal 103 (if a voltage source and not a current or some other source is used), and even the guarding voltages of guard signal 103 themselves, may be beyond the range defined by the pre-determined voltage and the filter capacitance reset voltage. It is also understood that one or multiple guard signals may be used in systems having multiple guarding electrodes 106. In addition, sensing electrodes may be used as guarding electrodes when they are "inactive" in not being used to sense.

In the embodiment shown in FIG. 1B-C, guarding electrode 106 is connected to an appropriate guarding voltage generating circuit 104. Guard voltage generating circuit 104 appropriately includes one or more switch(es) 114, which is implemented as an I/O of controller 102. Circuit 104 is any suitable circuitry capable of producing two or more different values of voltages on guarding electrode 106 in response to a signal applied by switch(es) 114, although particular examples of guard voltage generating circuit 104 are described below (e.g. in conjunction with FIGS. 3A-E and 4A-E). In various embodiments, passive guarding network 105 of circuit 104 is implemented with conventional passive impedance circuitry (such as a voltage or impedance dividing circuit) including one or more conventional resistors, inductors, and/or capacitors. Passive guarding network 105 is shown directly connected to guarding electrode 106 in sensor 100; in other implementations, switches, followers, or other elements may intervene.

In one embodiment, guard signal 103 includes voltages that are approximately equal to voltages associated with the charge transfer process. Guard signal 103 includes an "approximate-charging-voltage" that approximates the pre-determined voltage applied to any "active" sensing electrode(s) to charge them during the charging period (e.g. one or more of the sensing electrodes 112A-C associated with measurable capacitances). Guard signal 103 also includes an "approximate-sharing-voltage" that approximately equals the voltage associated with any "active" sensing electrodes being shared with the filter capacitance 110 during the sharing period when charge sharing is allowed. In this embodiment, the guarding signal 103 begins applying the approximate-charging-voltage to the guarding electrode 106 before the applying of the pre-determined voltage ends (i.e. before the charging period terminates). The approximate-charging-voltage can be applied at other times as well, such as during the entire charging period or during other portions of the charging period. There is flexibility in when to apply the approximate-charging-voltage since the active sensing electrodes (e.g. 112A-C) are driven during that period, and any effects of parasitic capacitances coupling guarding electrode 106 to the active sensing electrodes would be negligible. The guard signal 103 changes to begin applying the approximate-sharing-voltage to the guarding electrode 106 before the end of the sharing of the charge between any active sensing electrode (e.g. 112A-C) with the associated filter capacitance 110. Similar to the applying of the approximate-charging-voltage, there is flexibility in when to begin applying the approximate-sharing-voltage. For example, this applying of the approximate-sharing-voltage can take place during the entire duration of the period when charge is allowed to be shared between the active sensing electrodes (e.g. 112A-C) or only near the end of the period. For the guard to be effective, it should typically provide a relatively low impedance when applying these two approximate guarding voltages. However, the guard need not always be driven with a low impedance when not applying these two guarding voltages, though its effectiveness as a guard may be reduced.

The general sensor and guard scheme described above and shown in FIG. 1B can be supplemented or modified in many different ways. In various embodiments, an included capacitance (not shown) can be included in guard voltage generating circuit 104 to temporarily store charge removed from the various sensing channels associated with sensing electrodes 112A-C. This charge can be returned to the appropriate sensing channel (often back to the electrodes 112A-C themselves) during subsequent operation. Stated another way, by maintaining the charge on the included capacitance at a relatively constant value (e.g. through application of electrical signals using switch(es) 114), the net amount of charge shared between the filter capacitance 110 and the included capacitance through the sensing electrodes 112A-C can be reduced. Typically, the included capacitance is designed to be much larger (at least an order of magnitude or greater) relative to the particular total capacitance of guarded capacitances between sensing electrodes 112A-C and guarding electrode 106, and often larger than the associated filter capacitance 110. In such embodiments, the low impedance guarding signal 103 is relatively immune to coupling effects from sensing electrodes 112A-C and any other electrodes due to the much larger included capacitance. As a result, a single guarding electrode 106 may be used to effectively shield multiple sensing electrodes 112A-C from both undesirable internal and external coupling, including the coupling from one sensing channel to another, if the sensing scheme warrants. As shown, guarding signal 103 may be of low impedance and effective even when the switch(es) used to generate the guarding voltages are open. Many other enhancements or alterations could be made in addition to those described herein. For example, the output of a guard voltage generating circuit 104 might be actively buffered to provide a guard to multiple sensing electrodes, if the output is of high impedance.

With reference to FIG. 1C, an exemplary timing scheme 150 is shown that would be suitable for operating sensor 100 of FIG. 1B using a "switched RC time-constant" manner of charge transfer sensing. The particular timing scheme 150 shown in FIG. 1C applies predominantly to sensing of measurable capacitance of sensing electrode 112A. Similar processes would be executed to measure charge on the electrodes associated with measurable capacitances of sensing electrodes 112B-C as well. It should be noted that in cases where the various measurable capacitances share a common filter capacitance 110, the sensing channels associated with the sensing electrodes would typically be operated in sequence and not simultaneously for this particular example. However, parallel operation could take place in an equivalent embodiment such as one in which each measurable capacitance was provided with its own filter capacitance 110, or such as one in which a coded or frequency modulated sequence was applied to individual sensing channels.

During the "switched RC time-constant" sensing process shown in timing scheme 150, the measurable capacitance associated with sensing electrode 112A is provided with charging voltage pulses 201 using switch 116A. In this embodiment, switch 116A is implemented using a digital I/O of controller 102. Since a digital I/O can typically provide logic high and low voltages (e.g. $V_{dd}$, and GND), it is simple to apply a charge voltage pulse having the pre-determined voltage of $V_{dd}$. Between provisions of charging pulses 201, the measurable capacitance associated with sensing electrode 112A is allowed to discharge into filter capacitance 110 via passive impedance 108A. This is noted by the voltage traces for $V_x$ 117A (corresponding to the voltage on the measurable capacitance associated with sensing electrode 112A at the node coupled to switch 116A) and $V_F$ 115 (corresponding to the voltage on filter capacitance 110 at the node coupled to I/O 119). $V_x$ 117A rises to the pre-determined voltage (e.g. $V_{dd}$) when the pre-determined voltage is applied during the charging period, and then decreases with the time constant defined by the measurable capacitance associated with sensing electrode 112A and passive impedance 108A during the charge sharing period when the measurable capacitance discharges into filter capacitance 110. Meanwhile, the voltage on filter capacitance 110 slowly increases as it is charged by the measurable capacitance associated with sensing electrode 112A during the sharing period. During the sharing period, $V_x$ 117A and $V_F$ 115 approach the same value, since the two respective capacitances are sharing charge. In most embodiments, the sharing period will be set long enough to enable $V_x$ 117A and $V_F$ 115 to share enough charge such that they are essentially the same by the end of the sharing period. This makes the system less sensitive to timing variations.

Between a previous sharing period and a subsequent charging period, an optional "current canceling" voltage is applied to the measurable capacitance. The timing of the "current canceling" voltage is controlled so the amount of "parasitic" charge removed from the filter capacitance 110 is mostly equal to the amount of "parasitic" charge added to filter capacitance 110 through passive impedance 108A during the charging period, and the measurable capacitance is still left at the proper charging voltage before sharing with the filter capacitance 110. This may allow for a lower value for passive impedance 108A, and faster time constants as a whole without changing the measurable capacitance charge timing requirements.

The input/output pin 119 of controller 102 that provides switch 118 also measures the voltage 115 on the filter capacitance. The I/O 119 suitably contains or connects to a comparator (which is a one-bit quantizer that can be used to provide a signal bit analog-to-digital conversion), Schmitt trigger, CMOS threshold, and/or multi-bit analog-to-digital converter feature that is capable of measuring voltage $V_F$ 115 at various times (e.g. 202A-C) when switch 118 is open. When a comparator is used to measure the voltage 115, the $V_{TH}$ can be made roughly equivalent to the midpoint between the high and low logic values to simplify the system. $V_{TH}$ is roughly the midpoint between the high and low logic values with a simple exemplary CMOS threshold.

In the particular embodiment shown in FIGS. 1C, the measurable capacitance associated with sensing electrode 112A is charged and discharged until the voltage $V_F$ 115 on filter capacitance 110 exceeds a threshold voltage $V_{TH}$ associated with I/O 119. As I/O 119 senses that the threshold voltage $V_{TH}$ has been passed (indicated by point 202C), a reset signal 203 is provided using switch 118 of I/O 119. Switch 118 applies the reset signal 203 which resets the charge contained on filter capacitance 110 after voltage $V_F$ 115 exceeds a threshold voltage $V_{TH}$. FIG. 1C shows the "reading" of I/O 119 to measure the voltage on filter capacitance 110 immediately after a sharing period and starting only after some repetitions of the charge transfer process have already taken place (after a resetting of filter capacitance 110). However, as discussed earlier, other timing and frequency options exist for measuring the voltage on filter capacitance 110 and are contemplated here. For example, additional charge transfer processes could be performed and/or additional measurements made after voltage $V_F$ 115 exceeds a threshold voltage $V_{TH}$.

By tracking the number of charge transfer cycles performed from the applying of the reset signal 203 until the voltage on filter capacitance 110 exceeds the threshold voltage $V_{TH}$, the measurable capacitance can be effectively determined. That is, the number of repetitions of the charge transfer process performed to produce a known amount of charge on filter capacitance 110 (e.g. as indicated by the voltage at the measured node of the filter capacitance reaching $V_{TH}$) can be effectively correlated to the actual capacitance of the measurable capacitance. Similarly, the number of oscillations or resets of the filter capacitance 110 occurring for a number of the charge transfer processes can also be used to determine the measurable capacitance.

The embodiment shown in FIGS. 1B-C shows the reset signal 203 resetting filter capacitance 110 by setting the voltage on the node of the filter capacitance 110 coupled to switch 118 to local system ground, such that both sides of the filter capacitance are set at ground. This can be seen in the trace $V_F$ 115 dropping to $V_{RESET}$ in response to the reset signal 203. In other embodiments, resetting of filter capacitance 110 can be accomplished in a wide variety of ways, and the options available depend on the sensor configuration and sensing scheme chosen. In various embodiments, a reset signal 203 can be used to set one side of the filter capacitance 110, or the voltage across filter capacitance 110, to an appropriate reset voltage appropriate for the sensing. Resetting of filter capacitance 110 can also be accomplished by simply coupling a switch on one side of the filter capacitance 110 to the appropriate power supply voltage. Alternatively, where both sides of filter capacitance 110 are controlled by switches, the voltage on the filter capacitance 110 may be reset to a pre-determined value by applying known voltages on both sides of the filter capacitance 110. In addition, filter capacitance 110 can comprise a network of capacitors instead of one single capacitor, and each capacitor in the network may be reset to a different voltage and controlled by one or more switches, such that resetting filter capacitance 110 may involve opening and closing a multitude of switches.

Reset signal 203 may be provided periodically, aperiodically, or otherwise, and/or may not be provided at all in some embodiments to "reset" the sensor. However, such systems would still exhibit what may be considered a "reset voltage" for guarding purposes. For example, other embodiments utilizing RC networks do not have an equivalent of switch 118 (shown in FIG. 1B) for active resetting of the associated filter capacitances. Such a system can instead allow the voltage on the associated filter capacitance to reach what may be considered a "reset voltage" for guarding purposes by allowing charge transfer to through a passive impedance for a sufficient amount of time. As another example, some embodiments using oscillators or dual-slope conversions utilize alternating "charging" and "discharging" charge transfer processes to reach upper and lower thresholds, and do not need to be reset at all; in such cases, either or both the upper or the lower threshold may be considered a "reset voltage" for guarding purposes. A third example includes sigma-delta processes for capacitance sensing where the output of the sigma delta quantizer is kept approximately at a feedback threshold, and this feedback threshold may be considered a "reset voltage" for guarding purposes. These are but a few examples of other systems that may not actively reset, or even truly reset, but which still exhibit what can be considered "reset voltages" for guarding purposes.

Similarly, pre-determined charging voltages may also change for a particular sensing system, but the system will still exhibit what can be considered a "pre-determined charging voltage" for guarding purposes. For example, embodiments using both "charging" and "discharging" cycles may have two or more pre-determined charging voltages producing opposing charge transfer. In these cases, the "charging" pre-determined charging voltage and the "discharging" pre-determined charging voltage can both be used to define the guard signal 103.

In various embodiments, the "threshold" voltage is replaced by an A/D measurement of the voltage on the filter capacitance (or representative of the voltage on the filter capacitance), or by any other voltage determination as appropriate. By tracking the number of charge transfer iterations and/or the resulting voltage on the filter capacitance(s) as appropriate for the sensing scheme chosen, the amount of charge transferred to the filter capacitance(s) from the measurable capacitance(s) can be determined. This amount of charge corresponds to the value of measurable capacitance(s). Again, alternate embodiments may make use of other charge transfer schemes, including any sort of sigma-delta processing whereby the filter capacitance 110 is charged via a measurable capacitance and discharged by a "delta" charge through an impedance (not shown), or vice versa, and the like.

Figure 2A:
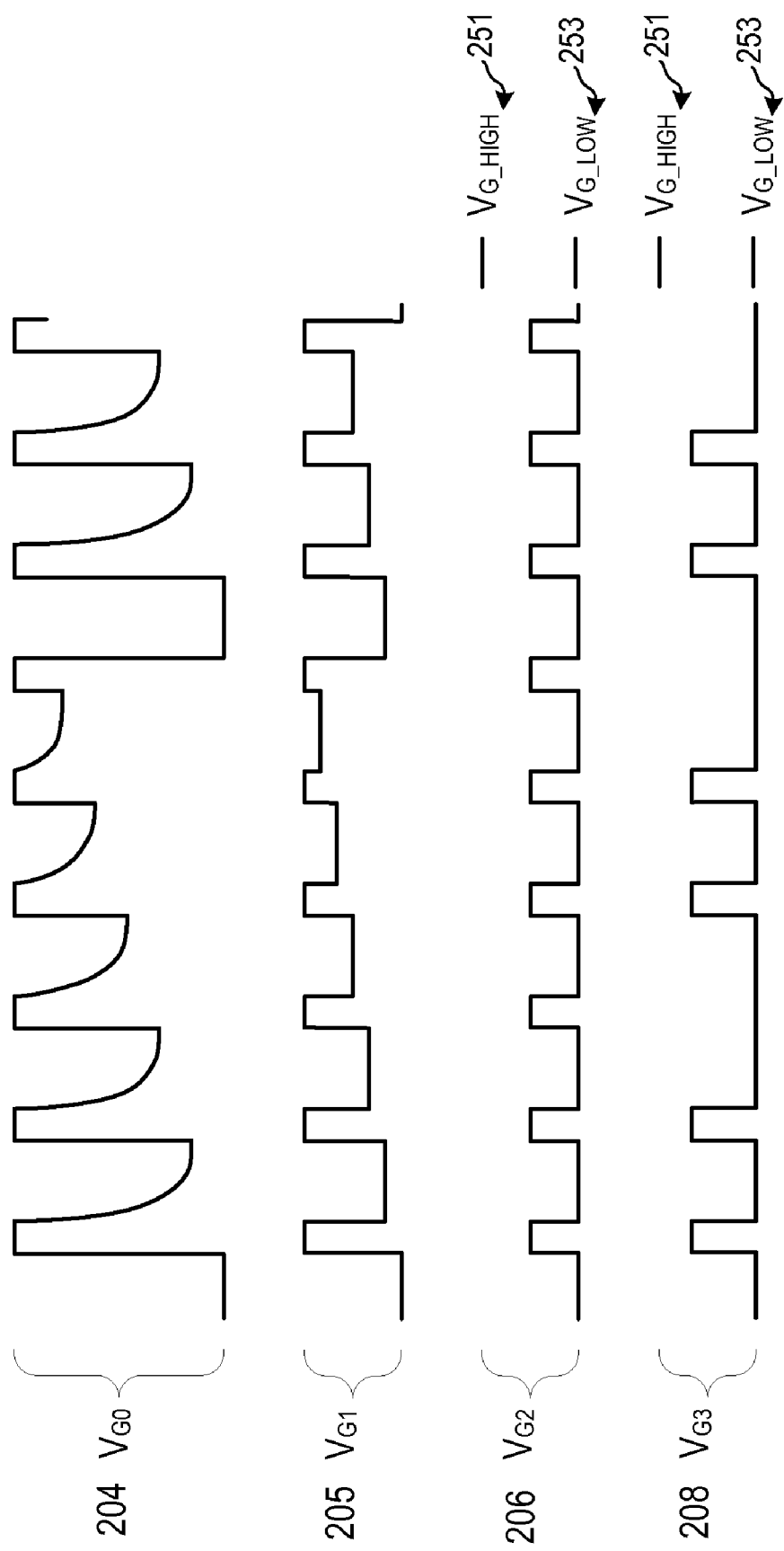
FIGS. 2A-B are timing diagrams of exemplary guard signals that can be applied to guarding electrodes.

There are many options for guard signal 103 that would be effective, and four such options are shown in FIG. 2A by traces 204 ($V_{G0}$), 205 ($V_{G1}$), 206 ($V_{G2}$), and 208 ($V_{G3}$). Trace 204 shows a "sensor matching" option. This "sensor matching" option can be used to match the voltage on a guarding electrode (e.g. 106) to the expected voltage on the measurable capacitance (e.g. voltage $V_X$ 117A on sensing electrode 112A) during the applying the pre-determined voltage steps and the charge sharing steps of the charge transfer processes of sensors utilizing switched time constant techniques. Trace 205 shows another "sensor matching" option, which can be used to match the expected voltage on the measurable capacitance during the applying the pre-determined voltage steps and the charge sharing steps of the charge transfer process for systems utilizing switched capacitance techniques having small or negligible time constants. Trace 206 shows a "switched voltage divider" option that can be used to approximate the expected voltage on the measurable capacitance for each repetition of the charge transfer process. Trace 208 shows a "pulse coded modulation" signal that can be used to approximate the expected voltage on the measurable capacitance over multiple performances of the charge transfer process. As shown by trace 208, the effect of pulse coded modulation is that the guard voltage of guard signal 103 does not transition with every performance of the charge transfer process, but does still follow a pattern.

It is understood that multiple types of charge transfer processes may be performed in synchrony or in series. Multiple similar charge transfer processes may be used, for example, to determine multiple measurable capacitances simultaneously or in sequence. Multiple similar charge transfer processes may also be used concurrently to obtain multiple determinations of the same measurable capacitance for a more accurate determination overall. Charge transfer processes that roughly oppose each other in effect may also be used to practice more complex measurement schemes. For example, a first charge transfer process may be used to charge a filter capacitance and a second charge transfer process may be used to discharge the same filter capacitance; one or more measurement(s) may be taken during the charge and discharge of the filter capacitance and used to determine the value of the measurable capacitance. Having such a charge up and charge down scheme may be useful in reducing the effects of environmental changes.

Multiple types of charge transfer processes (with associated guard voltages) can also be used to enhance the effects of guarding. For example, the pulse coded modulation can be considered to be a superimposition of multiple types of charge transfer processes (and associated guard voltages). The pulse coded modulation can thus be considered to repeat one, two, or more types of charge transfer processes (and associated guard voltages) in a particular sequence. These different types of charge transfer processes (and associated guard voltages) can apply the same predetermined voltage and use the same components, but may involve different guard signals. For example, a first charge transfer process (and associated guard voltages) can involve a first guard voltage and a second guard voltage different from the first guard voltage, while a second charge transfer process (and associated guard voltages) can involve a third guard voltage and a fourth guard voltage. In this example, the third guard voltage may be the same as the first guard voltage or the second guard voltage. Similarly, the fourth guard voltage may be the same as the first guard voltage or the second guard voltage. Further, the third guard voltage and the fourth guard voltage may be the same or different. The timing and values of the guard voltages would be determined by the average guard voltage swing appropriate for guarding the applicable sensing electrodes.

For the embodiment shown in FIGS. 1B-C, the option shown in trace 204 ($V_{G0}$) for guard signal 103 can track the voltage on the measurable capacitance to help prevent net charge from being gained or lost on the filter capacitance 110 due to guarded capacitance. Such a "sensor matching" guard signal shown by trace 204 exhibits voltages that resemble the voltages exhibited by an active sensing electrode (e.g. 112A-C) in a sensor using a "switched time constant" sensing technique such as described in FIGS. 1B-C. For example, the guard signal option shown by trace 204 can be configured to be roughly identical to the voltage expected for voltage $V_X$ 117A of the measurable capacitance associated with sensing electrode 112A shown in FIG. 1C (such as by selecting the ratio of capacitance 408 to capacitance 404 in FIG. 4A to be similar to the ratio of the measurable capacitance associated with sensing electrode 112A to the filter capacitance 110 of FIG. 1B). The first guard voltage of guard signal 103 would approximate that of the charging pulses 201, while the second guard voltage of guard signal 103 would decay to a voltage similar to that on $V_F$ 115 with a time constant similar to or faster than that exhibited by $V_X$ 117A. The second guard voltage of guard signal 103 also varies over executions of the charge transfer process, such that it has an overall rise that approximates the rise associated with $V_X$ 117A during those executions of the charge transfer process (and the rate of this change in the second guard voltage over executions of the charge transfer process can be considered to be another time constant of the system). A guard signal option shown by trace 204 can be generated using a circuit similar to that used by sensor 100 to perform the charge transfer process, or by others similar to other charge sensing circuitry. Circuits and methods for generating this "sensor matching" option by actuating switches to transfer charge onto the applicable guard capacitances are shown in FIGS. 3A-3C, 4A-C and discussed further below.

Figure 3B:
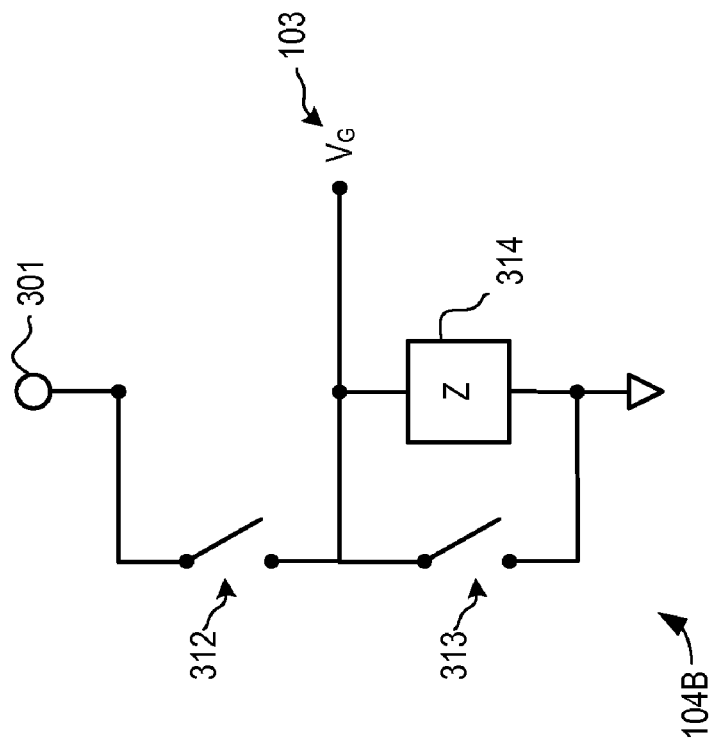
FIGS. 3A-E are block diagrams of exemplary circuits that could be used to generate guard voltages of a guard signal.

The option shown in trace 205 for guard signal 103 exhibits more discrete changes in guarding voltage and lacks the noticeable time-constant features during a single sharing period associated with the option shown in by 204. This "switched capacitance" option of trace 205 resembles that of a sensing system using a charge transfer process that actively switches to share the charge between an measurable capacitance and its associated filter capacitance instead of passively allowing charge to share through a passive impedance. The option shown in trace 205 applies a second guard voltage that remains relatively constant during a single sharing period but changes over sharing periods, as would be found in a sensor using a "switched capacitance" type technique for its charge transfer process. Circuits and methods for generating this "switched capacitance" option by actuating switches to transfer charge onto the applicable guard capacitances are shown in FIGS. 3C, 4C and discussed further below.

These "sensor matching" options for guard signal 103 may be advantageous over options with "simpler" waveforms (such as those shown in traces 206 and 208) in that they can be used to reduce charge transferred to the filter capacitance(s) due to the guarding electrode for every execution of the charge transfer process, and not just the net charge transferred during the course of the executions of the charge transfer processes leading to the determination of the measurable capacitance. This is facilitated by the second guard voltage that changes over repetitions of the charge transfer process. However, any guard signal 103 can be effective if it minimizes the net transfer of charge from the guarding electrode 106 to the filter capacitance 110 occurring during the execution of the set of charge transfer processes that eventually result in the measurement(s) of the voltage on filter capacitance 110 that is/are used to determine the measurable capacitance. This includes guard signal options that match a charge transfer process different from the one used by the sensor system, or ones that match no charge transfer process and simply swing between two or more substantially constant voltages (discussed below).

In many embodiments, it is often more practical to apply a guard signal 103 to guarding electrode 106 that does not minimize charge transferred from the guarding electrode 106 to the filter capacitance 110 during a single execution of the charge transfer process, but does minimize the net transfer of charge during the set of charge transfer processes that eventually result in measurement(s) of the voltage on filter capacitance 110 that are used to determine the applicable measurable capacitance. This can be done with a guard signal 103 that causes charge transfer in a first direction between guarding electrode 106 and filter capacitance 110 during one or more executions of the charge transfer process, and causes charge transfer in a second direction opposite the first direction during other execution(s) of the charge transfer process.

Figure 2B:
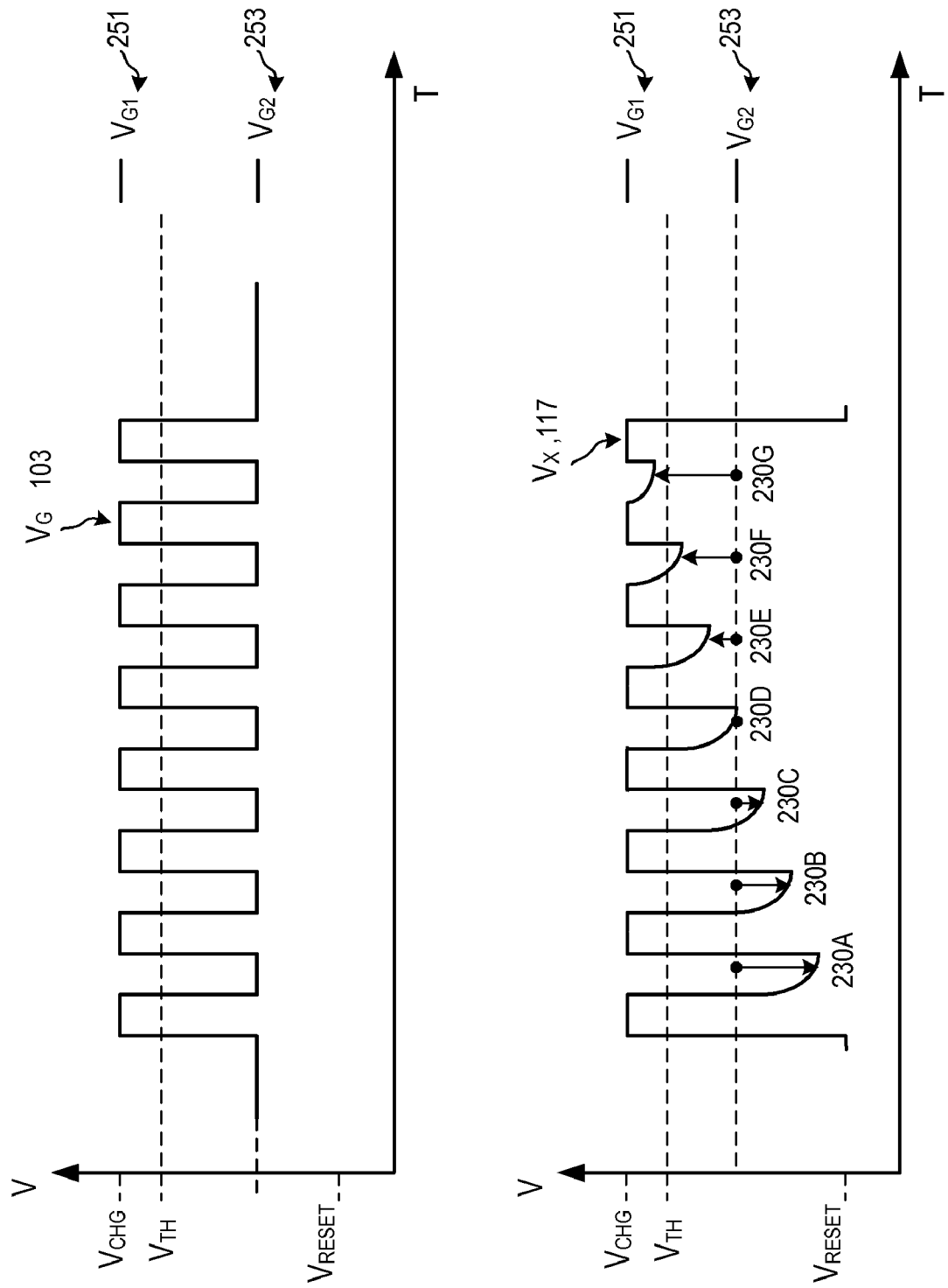

As shown by FIG. 2B, charge transferred onto the measurable capacitance from the guarding electrode in sharing periods when the voltage on the measurable capacitance is less than the second guard voltage value 253 is effectively restored with charge transferred onto the measurable capacitance from the guarding electrode in sharing periods when the voltage on the measurable capacitance is greater than the second guard voltage value 253. FIG. 2B also shows a guard signal 103 that includes a first guard voltage 251 for the duration when the pre-determined voltage is applied to the measurable capacitance and a second guard voltage 253 for the duration when the measurable capacitances shares. In FIG. 2B, the charge transfer between the guarding electrode 106 and the measurable capacitance is shown with arrows 230A-G. Arrows 230A-C indicate periods when charge is transferred from the guarding electrode 106 to the measurable capacitance and arrow 203E-G indicate periods where charge is transferred to the guarding electrode 106 from the measurable capacitance. Negligible charge is transferred at arrow (which appears as a dot) 230D, since voltage 117 is substantially equivalent to the second guard voltage 253 during that sharing period. The particular voltage values $V_{G\_HIGH}$ 251 and $V_{G\_LOW}$ 253 may vary significantly from embodiment to embodiment. Using this approach, the net charge transferred to the filter capacitance due to effects of the guarded capacitance can be very small relative to the total charge on the electrode during the charge transfer process, such that it can be considered approximately zero. Balancing the charge transfers between the guarded capacitance and the filter capacitance 110 over a sequence of executions of charge transfer processes can be further extended beyond the examples discussed herein and such extensions are within the scope of this invention.

For example, one option for guard signal 103 would swing between a first guard voltage approximating the pre-determined voltage and a second guard voltage approximating the average voltage on filter capacitance 110. To determine the average voltage of filter capacitance 110, the voltage on filter capacitance 110 is averaged over the set of charge transfer process that leads up to and generates the measurements of the voltage on filter capacitance 110 used to determine the measurable capacitance. For a given set of values for the expected measurable capacitance, filter capacitance, pre-determined voltage, reset voltage, threshold voltage, and ignoring (or accounting for if the model allows) the effects of any passive impedances, well-known methods can be used to model the circuit and determine what average filter-capacitance-voltage would minimize the effect of any guarded capacitances and provide an effective second guarding voltage. This average filter-capacitance-voltage is taken over discrete points, and is roughly the mean of the voltage on filter capacitance 110 taken over the executions of the charge transfer process between the resetting of the filter capacitance 110 and the last measuring of the filter capacitance 110 used to determine the measurable capacitance. Oftentimes, the change in the voltage on filter capacitance 110 will be roughly linear, such that the average filter-capacitance-voltage will be approximately the midpoint between the reset voltage and the threshold voltage.

It is also noted that these capacitance sensors are sampled systems (either actually or effectively). For example, in the embodiment shown in FIGS. 1B-C, the filtering capacitance 110 shares charge with the measurable capacitance only during discrete sharing periods when the pre-determined charging voltage is not applied. In addition, the voltage on the measurable capacitance also usually approaches the voltage 115 on filter capacitance 110 at the end of the charge sharing period. Therefore, it may be sufficient for the voltages of guard signal 103 applied to the guarding electrode 106 to match the voltage on the measurable capacitance only when the voltage on the measurable capacitance is "sampled" at the end of the charging period (when the applying of the pre-determined voltage terminates) and at the end of the charge sharing period. The end of the charge sharing period occurs when the applying of the pre-determined voltage begins in a switched time-constant system, such as the one shown in FIGS. 1B-C; the end of the charge sharing period occurs when the measurable capacitance is decoupled from the filter capacitance or when the filter capacitance is decoupled from any reference voltage, such as in switched capacitance systems. In other words, if charge sharing occurs through a passive sharing system, technically charge is always being shared; however, for guarding purposes, the charge sharing period may be considered to continue only until a subsequent applying of the pre-determined voltage (when charge sharing can be considered to end for guarding purposes). In contrast, if switching takes place to actively couple and allow sharing of charge by measurable and filter capacitances, the switching may be considered to define the end of the charge sharing period.

To that end, the options for guard signal 103 shown by traces 206 and 208 can be used. In the "switched voltage divider" option shown by trace 206, the actual guard signal 103 may alternate between a first guard voltage value 251 and a second guard voltage value 253 that approximates the "average" value of the voltage 115 on filter capacitance 110. Although this average-$V_F$ option has been termed the "switched voltage divider" option, no voltage divider is required; for example, first and second guard voltage values 251 and 253 can be achieved without any voltage dividers when they are power supply voltages, are voltages available through a DAC or another part of the sensor, or are produced using circuitry other than voltage dividers. The "switched voltage divider" term is used simply because a switched voltage divider circuit would likely be used in many embodiments of this type of guard signal. In the embodiment described in FIGS. 1A-B, the first guard voltage value 251 can be equal to the pre-determined charging voltage and the second guard voltage value 253 may be approximately equal to the average of a threshold voltage ($V_{TH}$) used to measure the filter capacitance and the reset voltage. Circuits and methods for generating this "switched voltage divider" are shown in FIGS. 3D-E, 4D-E and discussed further below.

The timing of the guard signal 103 is based upon the timing of the pulses 201 applied to measurable capacitance in that the guard signal 103 has the first guarding voltage value 251 while the charging pulses 201 are applied to the measurable capacitance, and the guard signal 103 has the second guarding voltage value 253 during the charge sharing periods between pulses 201. This timing may be useful in that the guard signal 103 can be driven by existing clocks in the system. However, in practice, the guard signal 103 can be as effective even if it only begins applying the first guarding voltage value 251 sometime after the associated charging pulse 201 begins, as long as the first guarding voltage value begins to be applied before the end of the associated charging pulse 201. Similarly, the guard signal 103 can be as effective even if it does not apply second guarding voltage value 253 for the entire sharing period, as long as it begins to apply this second guarding voltage value 253 before the end of the charge sharing period. The timing of the guard signal 206 may not be exactly matched to the charging pulses 201 for many reasons. For example, imprecise timing may cause the guard signal 103 to start changing to a second guarding voltage before charge sharing between the measurable capacitance and the filter capacitance begins, such that the guarding is less effective; to reduce the effects of such imprecise timing, it may be desirable to extend portions of the guard signal 103.

Trace 208 shows an alternate embodiment for guard signal 103 which can be achieved with fewer components. For example, a single I/O with no additional components can be used to generate trace 208, as shown in FIG. 4F. With the option shown in trace 208, instead of applying a first guard voltage value 251 for each of the charging pulses 201, one or more changes of the guard signal 103 to second guard voltage value 253 can be omitted to adjust the average swing of the guard voltage applied and minimize the net charge transferred by the guarded capacitance to the filter capacitance (e.g. 110). That is, by extending the duration of application of one guard voltage value (such as the second guard voltage value 253 in trace 208) instead of transitioning to the other guard voltage value (such as to the first guard voltage value 251), the average guard voltage swing applied to guarding electrode 106 can be modified in a manner similar to pulse-coded modulation (also "pulse-frequency modulation"). That is, by applying less frequent charging pulses (e.g. extending voltage 251 and/or voltage 253) and having fewer transitions, the average swing of guard voltage 103 on guarding electrode 106 is reduced, as compared to when more frequent charging pulses are applied. Notice that the average guard voltage swing can remain ratiometric to the pre-determined charging voltage swing over multiple cycles, so as to maintain high performance by improving power supply noise rejection. Circuits and methods for generating this "pulse-coded modulation" option are shown in FIGS. 3D-E, 4D-E and discussed further below.

Many changes can be made to the basic structures and operations shown in FIGS. 1B-C. The timing scheme 150 shown in FIG. 1C assumes a "positive" transfer of charge from the measurable capacitance associated with sensing electrode 112A to filter capacitance 110, for example, whereas equivalent embodiments could be based upon sharing of charge in the opposite direction (that is, positive charge could be placed on filter capacitance 110 that is drawn through impedance 108 to the measurable capacitance associated with sensing electrode 112A, then discharged by pulses 201 provided by switch(es) 114). Alternatively, the threshold-based sensing scheme shown in FIG. 1C could be replaced with any sort of measurement scheme, including any technique based upon measurement of the voltage 115 $V_F$ on filter capacitance 110 after a pre-determined number of executions of the charge transfer process. Further, pulses 201 used to charge or discharge the measurable capacitance need not be equally spaced in time or be of equal duration. Indeed, in many embodiments, controller 102 could process interrupts or other distractions at virtually any point of the measurement process, since variations in timing are easily tolerated by many of the embodiments shown herein. This is especially true when the sampling time exceeds the time constants for settling. Alternately, intentionally varying the spacing in time of pulses 201 may spread the sampling spectrum to better tolerate noise.

Many changes can be made to the basic structures and operations shown in FIGS. 2A-B. The timing scheme 200 shown in FIG. 2A shows the first guard voltage is roughly constant and the second guard voltage as the one changing if such change were to occur. However, since the guard voltage "swing" (difference between the first and second guard voltage aside from transition periods) matters more than the actual guard voltage values, the guard signal 103 can also be implemented with the first guard voltage changing instead of the second guard voltage, or both first and second guard voltages changing. Similarly, as discussed earlier, the timing for the guard voltage changes have great flexibility.

Turning now to FIGS. 3A-E, various embodiments (circuits 104A-E) of a guard voltage generating circuit 104 are shown. Circuit 104 can include any number of impedances and switches and utilize any number of reference sources as appropriate. For example, each of the impedances shown in FIGS. 3A-D can represent the impedance due to a single component or network of components. Active components in addition to switches, such as multiplexers, DACs, current sources, or OP-AMPS, can also be included in guard voltage generating circuit 104, but are not required and not used in most embodiments. In addition, the switches of guard voltage generating circuit 104 can be any discrete switch or relay, for example, or could correspond to any switching or multiplexing functionality contained within controller 102 described above. Switches used by voltage generating circuit 104 could be implemented as switch(es) 114 using an I/O pin of controller 102. The output of one I/O can sometimes provide multiple switches; for example, a digital I/O capable of providing power supply voltages and a high impedance state may be used to provide the functionality of one multi-way switch, or two switches, coupled to one node. Digital I/Os may also provide pull-up resistances, or pull-down resistances or current sources.

If any of the switches are enabled with an I/O capable of providing switching and measuring functionality, then the sensing system would have the added option of reading the guard signal 103. This would allow the system to adjust the guard signal 103 dynamically in response to what voltages it reads as provided to guard signal 103 (such as by changing the pulse coding if a pulse coded scheme is available).

Impedances of circuit 104 can be any conventional resistances, inductances, capacitances and/or other impedance elements. Thus, the voltage across an impedance in circuit 104 may be affected by prior history of the nodes connected to the impedance. This "prior history" effect may be especially significant for capacitive and inductive elements, and this effect can be controlled to define the guard signal 103. Any reference sources providing references such as reference voltage can be internal or external to controller 102. Convenient references can be used. For example, a reference voltage may be provided by a power supply voltage ($V_{dd}$, GND, $-V_{dd}$) or battery voltage, and the like, and the actual reference voltage used may be directly from the source or some version of these voltages adjusted by impedances. In the examples shown in FIGS. 3A-E, one reference voltage is shown as reference voltage 301 and a second reference voltage is shown as local system ground for convenience of explanation; as discussed earlier, other reference voltage values can be readily used by guard signal generating circuit 104.

Figure 3A:
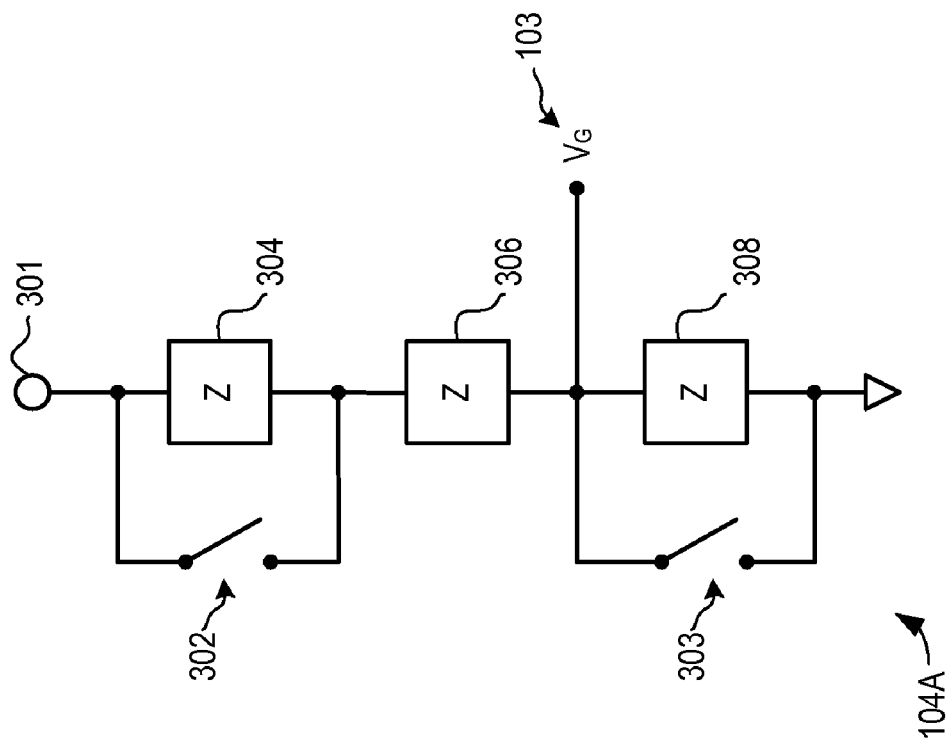

FIG. 3A shows a configuration of a guard voltage generating circuit 104A including a passive guarding network comprising three impedances 304, 306, 308. The three impedances 304, 306, 306 are located in series between a reference voltage 301 and ground. Switch 302 is located in parallel with impedance 304 and switch 303 is located in parallel with impedance 308. (As discussed earlier, switches 302 and 303 can be implemented as switches 114 of FIG. 1 as appropriate) In the embodiment shown in FIG. 3A, guard signal 103 can be provided by appropriately switching switches 302, 303. When switch 302 is closed and switch 303 is open, the voltage of guard signal 103 is determined by the reference voltage 301 and the voltages across impedances 306 and 308. This voltage of guard signal 103 could correspond to a reset voltage of a charge transfer process that is being guarded. When both switches 302 and 303 are open, the voltage of guard signal 103 is determined by the reference voltage 301 and the voltages across impedances 304, 306, and 308. This voltage of guard signal 103 could correspond to the voltage on a filter capacitance in a charge transfer process that is being guarded. When switch 302 is open and switch 303 is closed, the voltage of guard signal 103 is driven to GND. This voltage of guard signal 103 could correspond to a pre-determined charging voltage of a charge transfer process that is being guarded. With proper choice of impedances 304, 306, 308, a configuration such as circuit 104A allows a guard voltage generating circuit that emulates the voltages associated with charge transfer processes utilizing a "switched time constant" technique, such as in FIGS. 1B-C. For example, the impedance 304 could be configured to correspond with a filter capacitance formed from a network of components, and impedance 304 could be coupled to more than one voltage to accurately correspond to that of the matched filter capacitance. Note that a variety of reset voltages and charging voltages may be guarded though they may require different switching sequences or references voltages (e.g. $V_{dd}$ and ground).

For the embodiment shown in FIG. 3A, when switch 302 is open and switch 303 is open, impedances 304, 306, and 308 form an impedance divider with "common nodes" where impedance 306 connects to impedance 308 and where impedance 304 connects to impedance 306. When switch 302 is closed and switch 303 is open, impedances 306 and 308 form a different impedance divider with a common node where impedance 306 connects to impedance 308.

An impedance divider is composed of at least two passive impedances in series, where each passive impedance is coupled to at least two nodes. One of these nodes is common to both impedances ("a common node" to which both impedances connect.) The common node serves as the output of the impedance divider. The output of the impedance divider is a function of the voltages and/or currents applied at the "unshared" nodes (the nodes of the two impedances that are not the common node) over time. A simple example of an impedance divider is a voltage divider composed of two capacitances or two resistances. More complex impedance dividers may have unmatched capacitances, resistances, or inductances in series or in parallel. One impedance may also have any combination of capacitive, resistive, and inductive characteristics.

In the exemplary embodiment of guard voltage generating circuit 104B shown in FIG. 3B, the passive guarding network is comprised of impedance 314. For circuit 104B, guard signal 103 is suitably switched by switch 312 between reference voltage 301 when switch 312 is closed; this voltage of guard signal 103 could correspond to a pre-determined charging voltage. Guard signal 103 suitably switches to a second voltage defined by the voltage across impedance 314 when switch 312 is open; this voltage of guard signal 103 could correspond to the voltage on a filter capacitance. Switch 313 could be closed to remove charge from impedance 314; this voltage of guard signal 103 can correspond to a reset voltage. With proper choice of impedance 314, a configuration as circuit 104B allows a guard voltage generating circuit that emulates the voltages associated with a charge transfer processes utilizing a sigma-delta version of the "switched time constant" technique.

FIG. 3C shows another embodiment of the guard voltage generating circuit 104C that includes a passive guarding network comprised of two impedances 324, 326 in series. Circuit 104C is driven by three switches 322, 323, and 325. When switch 322 is closed and switches 323 and 325 are open, the guard signal 103 is the reference voltage 301; this voltage of guard signal 103 could correspond to a pre-determined charging voltage. When switches 322 and 323 are open, and switch 325 is closed, the guard signal 103 is determined by the reference voltage 301 and the voltage across impedances 324, 326; this voltage of guard signal 103 could correspond to the voltage on a filter capacitance. When switch 323 and 325 are closed and switch 322 is open, the guard signal 103 is GND and the charge on impedance 326 is removed; this voltage of guard signal 103 could correspond to a reset voltage. When switches 322 and 323 are open and switch 325 is closed, the impedances 324 and 326 form an impedance divider with a common node at the guard signal 103 output. With proper choice of impedances 324 and 326, a configuration such as circuit 104C allows a guard voltage generating circuit that emulates the voltages associated with charge transfer processes utilizing a "switched capacitance" technique.

Figure 3D:
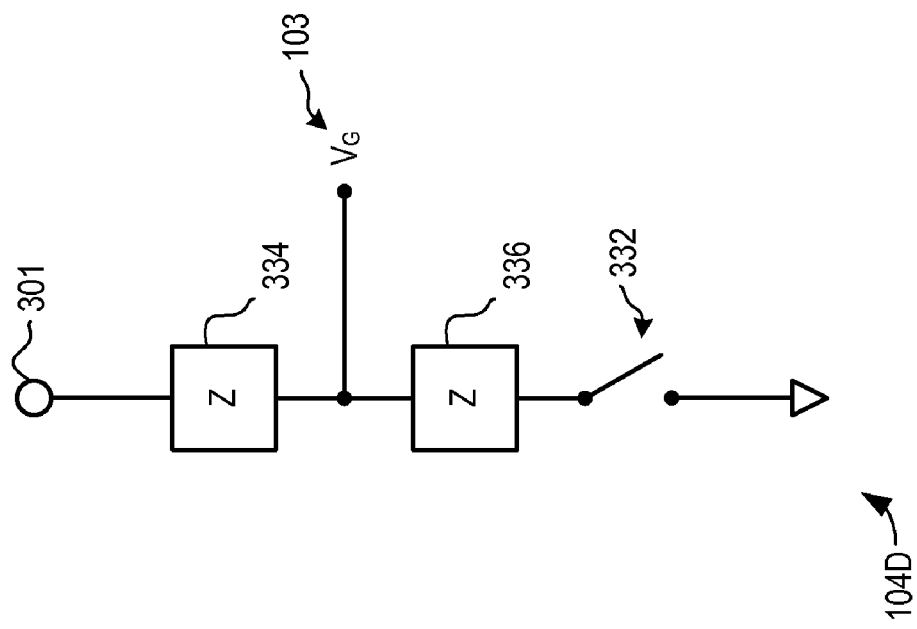
Figure 3C:
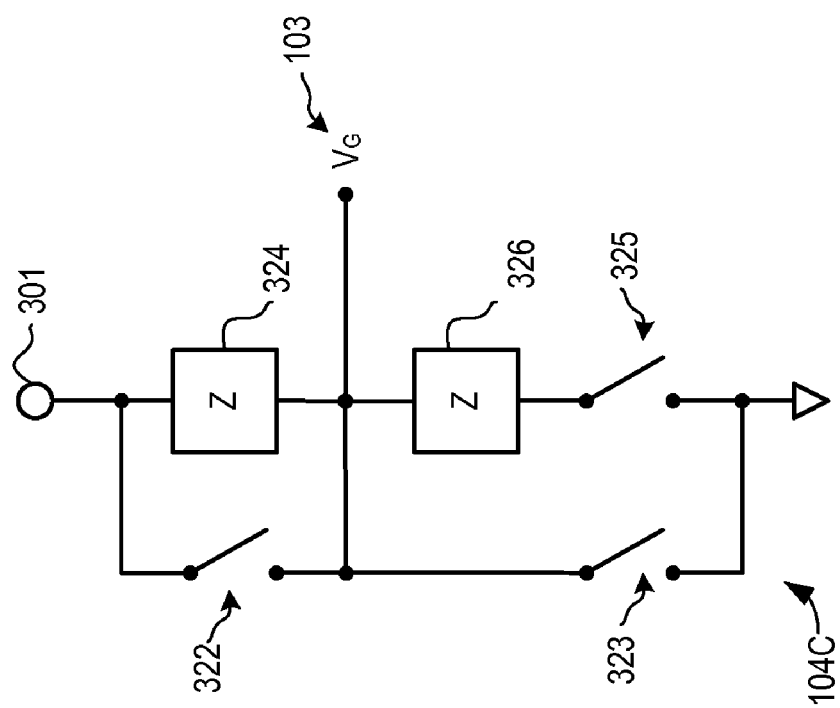

FIG. 3D shows an embodiment of the guard voltage generating circuit 104D with a passive guarding network comprising two impedances 334 and 336 located in series with the reference voltage 301 and a switch 332 to ground (GND). In circuit 104D, guard signal 103 is suitably switched using switch 332. When switch 332 is open, the guard signal 103 is determined by reference voltage 301 and the voltage across impedance 334; this voltage of guard signal 103 could correspond to a pre-determined voltage. When switch 332 is closed, the guard signal 103 is determined by reference voltage 301 and the voltages across impedances 334 and 336; this voltage of guard signal 103 could correspond to an average voltage on a filter capacitance. When switch 332 is closed, the impedances 334 and 336 form an impedance divider that appropriately divides the reference voltage 301 as determined by the type and value of impedance components chosen. That is, impedances 334 and 336 suitably function as a "pull-up" component when switch 332 is open, and impedances 334 and 336 function as an impedance divider when switch 302 is closed. In the simple case where resistors are used for impedances 334 and 336, the impedance divider is a conventional voltage divider and the guard signal 103 when switch 332 closed is proportional to reference voltage 301 via the ratio of the resistance of impedance 336 to the sum of the resistances of impedances 334 and 336. With proper choice of impedances 324 and 326, a configuration as circuit 104D allows a guard voltage generating circuit 104 for "switched voltage divider" type of guard signal 103. The output of circuit 104D can be further adapted, such as modulated in frequency, to produce a "pulse coded modulation" type of waveform for guard signal 103.

Figure 3E:
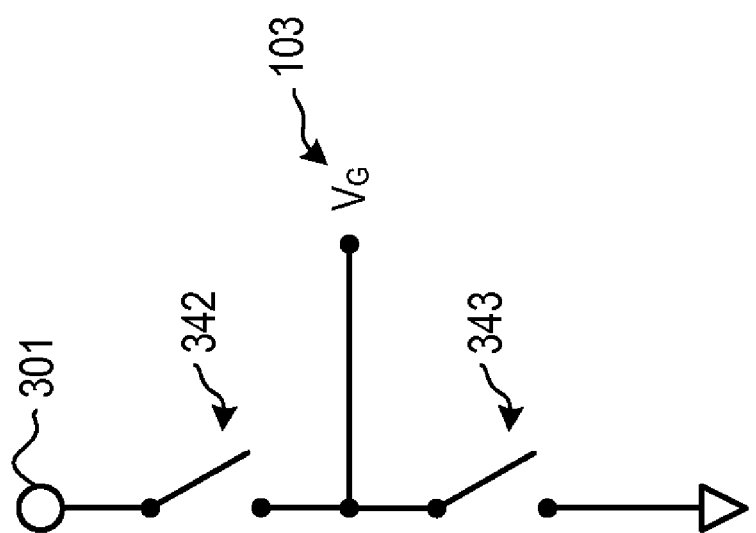

FIG. 3E shows another embodiment of guard signal generating circuit 104E that includes a two switches 342 and 343 coupled to reference voltage 301 and ground, respectively, and no discrete impedances. In the embodiment of 104E, the passive guarding network can thus comprise a simple wire. In circuit 104E, the guard signal suitably switches between reference voltage 301 when switch 342 is closed and switch 343 is open, and ground when switch 342 is open and switch 343 is closed. The configuration of circuit 104E allows a guard voltage generating circuit 104 to provide a degenerate "switched voltage divider" type of guard signal 103 (where there is no voltage divider and the guard signal switches between undivided reference voltage 301 and ground). The configuration of circuit 104E is especially useful for a "pulse coded modulation" type of waveform for guard signal 103, where the guard signal 103 does not change in voltage in step with all repetitions of the charge transfer process used to detect stimulus 101.

The embodiments of guard voltage generating circuit 104 shown in FIGS. 3A-3E are but five examples of the various alternatives that can be used to determine the guard signal 103. Many other options for providing guard signal 103 using switches with and without passive guarding networks comprised of impedances in series and/or parallel and are contemplated here. These alternatives may be quite similar to those shown in FIGS. 3A-3E. For example, an additional impedance could couple impedance 306 to another reference voltage in parallel with impedance 304 for circuit 104A. As another example, impedance 314 of circuit 104B can be in parallel with switch 312 instead of switch 313. As a third example, switch 325 of circuit 104C can couple impedance 324 to reference voltage 301 instead of couple impedance 326 to ground. As a further example, switch 332 of 104D can be coupled between impedance 334 and reference voltage 301 instead of between impedance 336 and ground. Other alternatives may differ more drastically, and involve impedances and switches in other configurations.

Figure 4A:
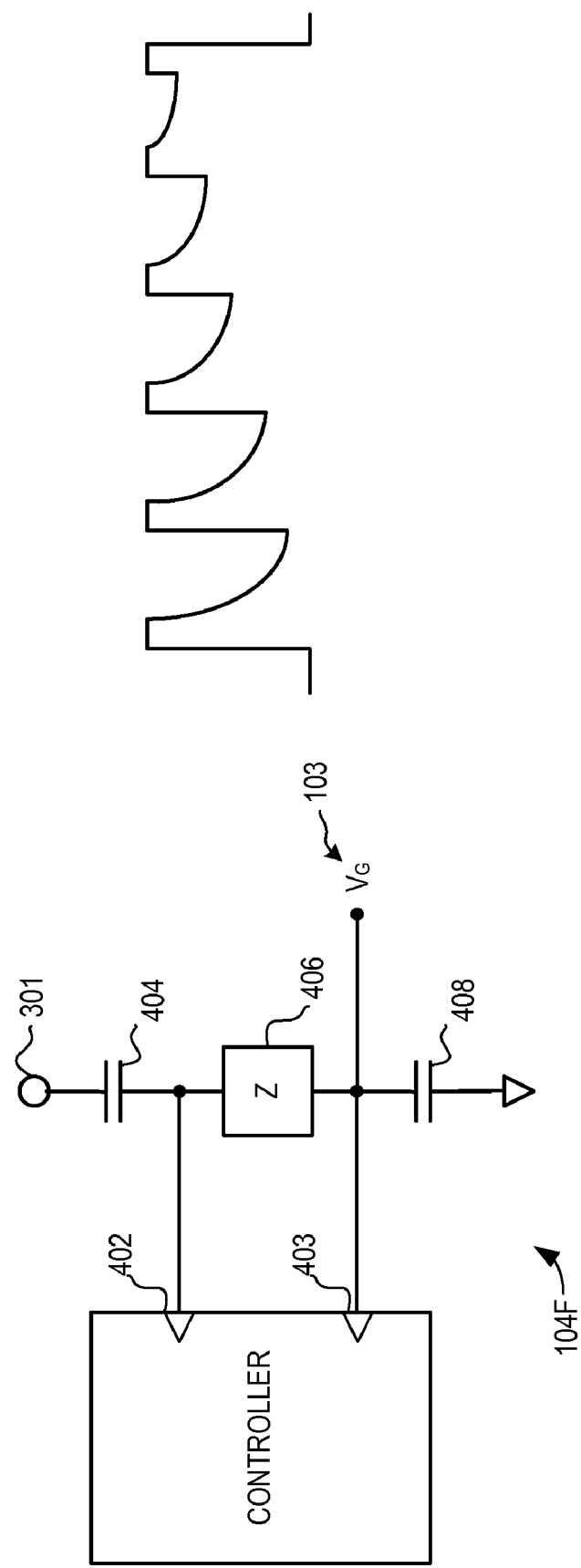
Figure 4B:
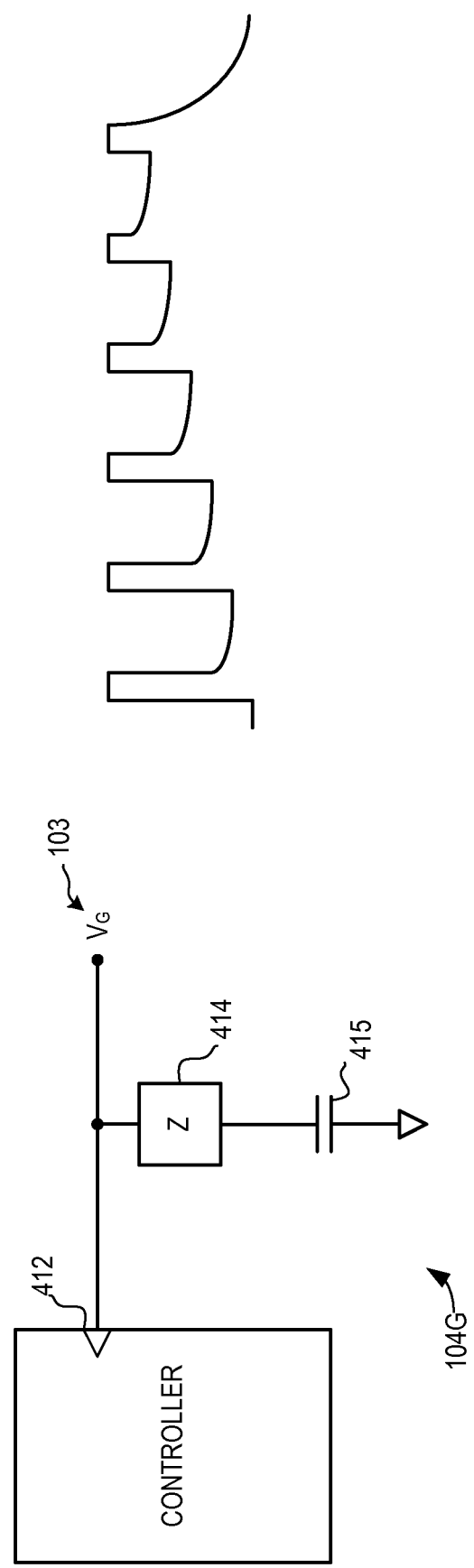
Figure 4C:
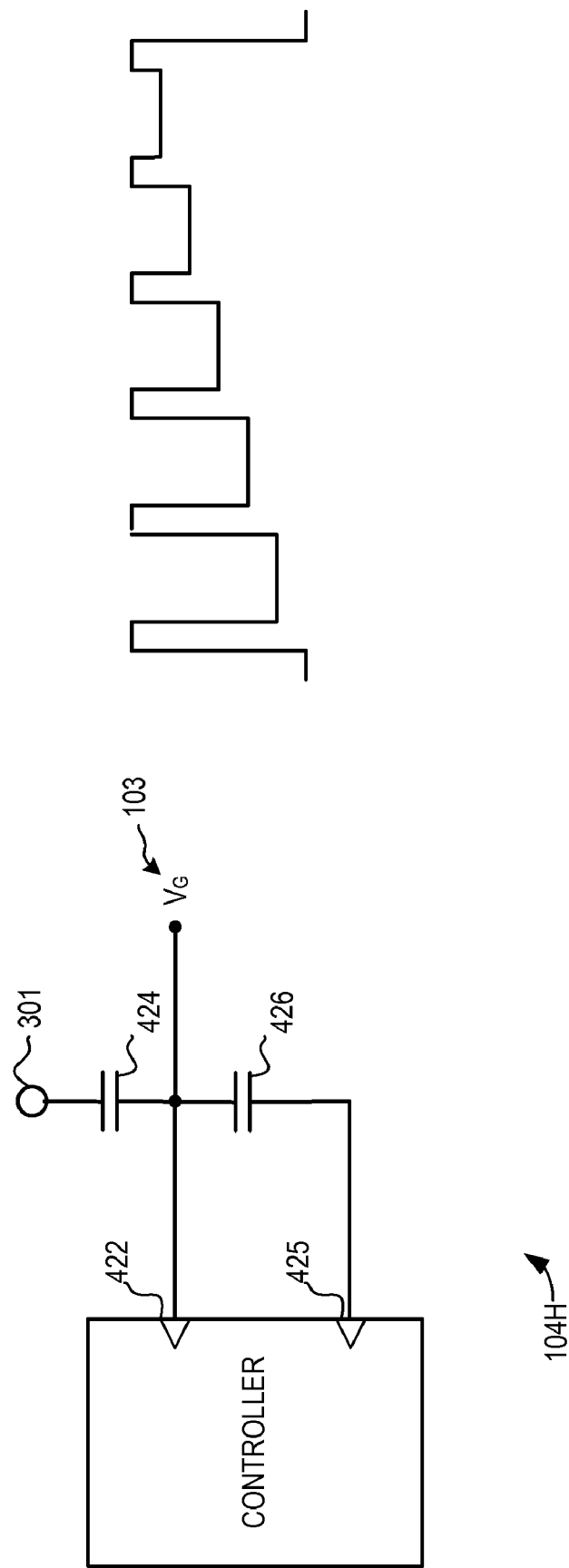

Turning to FIGS. 4A-E, examples with more detail of guard voltage generating circuits 104 are shown in conjunction with a controller such as the controller 102 of FIG. 1B. The exemplary circuit 104F shown in FIG. 4A, is an embodiment of the circuit 104A shown in FIG. 3A where impedance 304 is implemented as a capacitance 404, impedance 306 is implemented as resistance 406, and impedance 308 is implemented as capacitance 408 and where switch 302 has been implemented using I/O 402 and switch 303 has been implemented using I/O 403. The configuration of circuit 104F is quite similar to that of the circuitry used to practice the charge transfer process of sensor 100 (FIG. 1A). Capacitance 408 is analogous to a measurable capacitance, resistance 406 is analogous to a passive impedance (e.g. 108A-C), and capacitance 404 is analogous to the filter capacitance 110. Switch 302 as implemented using I/O 402 is analogous to switch 118, and switch 303 as implemented using I/O 403 is analogous to switches 116A-C implemented using I/O 119 (FIG. 1B). I/O 403 itself is analogous to I/O 119 (FIG. 1B). The circuit 104F can thus be driven in a way to match the charge transfer process such that the guard signal 103 would roughly match the voltage 117 of a charge transfer sensing process as shown in FIGS. 1B-C, and minimize charge transfer from the guarding electrode 106 to the filter capacitance 110 at all points of the charge transfer processes used for sensing. Even if a guard signal 103 that differs from voltage 117 is generated using circuit 104F, it can still be quite effective if it minimizes overall charge transferred between the guarding electrode 106 and the filter capacitance 110 for the set of charge transfer processes that results in the measurements used to determine the value of measurable capacitance.

The example circuit 104G shown in FIG. 4B is an embodiment of the circuit 104B of FIG. 3B. Both switches 312 and 313 have been implemented using a single I/O 412, and the impedance 314 has been implemented as a network having a resistance 414 and capacitance 415. The example circuit 104G can be driven using something similar to a "one I/O sigma delta" type "switched time constant" methodology. In such a methodology, switch 313 of I/O 412 is opened (if it is not already open) and switch 312 of I/O 412 is closed to apply the reference voltage 301 (which is the pre-determined voltage), and then switch 312 of I/O 412 is opened to allow charge to share between any guarded capacitances in the system and capacitance 415. When switch 312 of I/O 412 is closed, the capacitance 415 is charged through impedance 414. Closing switch 313 of I/O 412 discharges capacitance 415 through impedance 414. The voltage on capacitance 415 can be measured using I/O 412, and this voltage can be reduced as necessary by closing switch 313 of I/O 412 when the pre-determined voltage is applied to the measurable capacitance (so as not to directly affect the guarded capacitance charge transfer). In this way, the voltage on capacitance 415 can be controlled to the second guarding voltage. This cycle of first opening switch 313 and closing switch 312 of I/O 412, and then opening switch 312 and closing switch 313 of I/O 412 can be repeated in synchrony with the charge transfer process used to detect proximity and measure the measurable capacitance. The circuit 104G can thus be driven in a way to generate a guard signal 103 that roughly matches the voltages of the measurable capacitance in a charge transfer process such as the one shown in FIGS. 1A-B. Circuit 104G can also be driven in a way to generate a guard signal 103 that closely matches the voltages of the measurable capacitance in a single I/O sigma-delta charge transfer process.

The example circuit 104H shown in FIG. 4C is an embodiment of the circuit 104C of FIG. 3C. Switches 322 and 323 have been implemented using I/O 422, and switch 325 has been implemented using I/O 425. Impedance 324 has been implemented as capacitance 424, and impedance 326 has been implemented as capacitance 426. The example circuit 104H is analogous to a "switched capacitance" circuit where capacitance 424 (which is a fixed capacitance) is analogous to the measurable capacitance and capacitance 426 is analogous to the filter capacitance. Example circuit 104H can be driven using something similar to a "switched capacitance" methodology. In such a methodology, switch 322 of I/O 422 is closed and switch 323 of I/O 422 is opened to apply the reference voltage 301 (which is the pre-determined voltage in the embodiment shown in FIG. 4C) to capacitance 424. Then, switch 322 of I/O 422 is opened and switch 325 of I/O 425 is closed to allow charge to share between capacitances 424 and 426. This cycle of first closing switch 322 of I/O 422 and then opening switch 322 of I/O 422 and closing switch 325 of I/O 425 can be repeated synchronous with the charge transfer process used to detect proximity and measure the measurable capacitance. After the appropriate number of cycles (such as to when the number of executions of the charge transfer process used to generate the results used to determine the measurable capacitance have been performed), switch 323 of I/O 422 and switch 325 of I/O 425 can close to reset the charge on capacitance 426. The circuit 104G can thus be driven in a way to generate a guard signal 103 that has a first guard voltage that is the pre-determined voltage and a second guard voltage that is substantially constant within an execution of the charge transfer process but that rises from the reset voltage with each subsequent execution of the charge transfer process before reset. This guard signal 103 would then approximate the voltages of the measurable capacitance in a charge transfer process if the ratio of the fixed capacitance 424 to capacitance 426 is comparable to the ratio of the measurable capacitance to the filter capacitance.

Figure 4D:
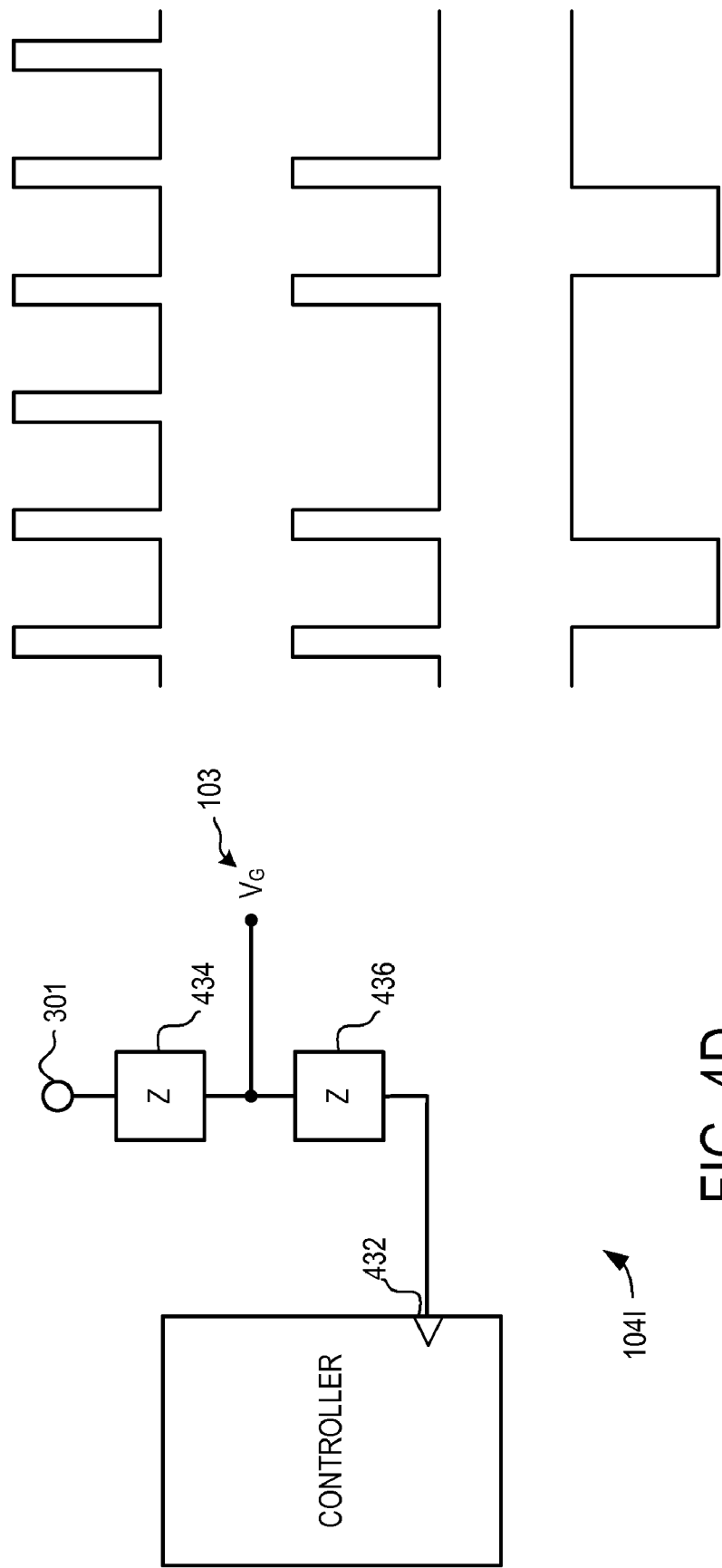

The example guard signal generating circuit 104I shown in FIG. 4D is an embodiment of the circuit 104D shown in FIG. 3D. Impedance 334 has been implemented using resistance 434, impedance 336 has been implemented using resistance 436, and switch 332 has been implemented using I/O 432. When switch 332 of I/O 432 is open, the guard signal 103 approaches the reference voltage 301. When switch 332 of I/O 432 is closed, the guard signal 103 is set to a voltage that is proportional to the reference voltage 301 by the ratio of resistance 436 to the sum of resistances 434 and 436. With the circuit 104I embodiment, a guard signal 103 can be used to approximate the average swing of voltage associated with the measurable capacitance. For example, for the sensor 100 of FIG. 1B, the first guard voltage can be applied by opening switch 332 of I/O 432 and applying reference voltage 301 (which can be the pre-determined voltage, for example). Then, the second guard voltage can be applied by closing switch 332 of I/O 432 and applying a fraction of reference voltage 301 (which can be halfway between the applicable threshold voltage and the reset voltage, for example). With the proper timing of the first and second guard voltages defining when and how long they are applied relative to each other and the steps of the charge transfer process used for sensing, and with the proper selection of resistance and reference voltage values, this guard signal 103 can then exhibit a voltage swing that would then approximate the average voltage swing of the applicable measurable capacitance in the charge transfer executions and provide effective guarding.

The signal 103 of circuit 104I can be further adapted with pulse coded modulation of the switching of switch 332. By changing the frequency of the switching and thus the transition between the guard voltages, a different actual guard voltage swing can be generated. Pulse coded modulation can actually be applied to any circuit 104 when control of the frequency of transition is available. However, in cases where the guard signal 103 already approximates the actual voltage 117 exhibited by the measurable capacitance or its average, pulse coding may offer little or no advantage.

The example guard signal generating circuit 104J shown in FIG. 4E is an embodiment of the circuit 104E shown in FIG. 3E. The I/O 442 can be directly connected to the guarding electrode(s), such that there is negligible impedance. Switches 344 and 346 of circuit 104E have been implemented using a single I/O 442. When switch 342 of I/O 442 is closed and switch 343 of I/O 442 is open, the guard signal 103 is set to the logic "high" reference voltage 301 (e.g. $V_{dd}$ if I/O 442 is a conventional digital I/O). When switch 342 of I/O 442 is open and switch 343 of I/O 442 is closed, the guard signal 103 is set to logic "low" reference voltage (e.g. ground). With the circuit 104J embodiment, since the reference voltage and ground may be set by the limitations of controller 102, it is likely more difficult to generate a guard signal 103 with a swing for each charge transfer process. Therefore, the circuit 104J may be very amenable to pulse coded modulation. With the proper ratio of transitions between the first and second guard voltages (which can be the pre-determined voltage and ground, respectively), an average guard voltage swing can be generated for guard signal 103 that approximates the average voltage swing exhibited by the measurable capacitance. For example, if the guard signal 103 transitions between the first and second guard voltages three times for every five executions of the charge transfer process for detecting proximity, the average guard voltage swing is three-fifth of the voltage swing between one transition of the first and second guard voltages.

As discussed earlier, in all of the examples 4A-4E where the switching is generated using a component that also has measurement capabilities, such as using a digital I/O of a controller, the I/O can also be used to measure the voltage of guard signal 103 as to adjust the guard signal 103 as necessary. The adjustment may take place for the current set of executions of charge transfer processes used to generate the measurement(s) for determining the measurable capacitance, or may take place for the next set of charge transfer processes.

As noted above, many of the embodiments described herein may be readily implemented using commercially-available components such as conventional integrated circuits and any combination of discrete resistors and/or capacitors. Because of this simplicity, many different types of sensors 100 can be created that share or do not share various components and/or switches. For example, the measurable capacitances associated with the sensing electrodes 112A-C in FIG. 1B are coupled to a common filter capacitance 110, but in practice each channel could be coupled to its own filter capacitance 110. Similarly, one or more passive impedances 108A-C and/or any number of switches (e.g. 114, 116A-C, 118) and I/Os (e.g. I/O 119) could be shared between sensing channels in alternate embodiments. This sharing may be exploited across many additional channels to create sensors capable of efficiently sensing numerous measurable capacitances with a single controller 102. This sharing can reduce cost and size of the overall sensor 100 significantly.

By implementing multiple sensing channels on a common controller 102, a number of efficiencies can be realized. Frequently, sensing electrodes and/or guarding electrode(s) can be readily formed on a standard printed circuit board (PCB), so duplication of these elements is relatively inexpensive in a manufacturing sense. In a case where the measurable capacitances are expected to be relatively small, then filter capacitance 110 may also be manufacturable in a PCB. In addition, none or one or more resistances, capacitances, and inductances may be formed on a PCB to provide impedances used in the guard voltage generating circuit 104, such as capacitance 404 and resistance 406 of circuit 104F. As a result, many of the various features described above can be readily implemented using conventional manufacturing techniques and structures. However, in some cases, components such as filter capacitance(s) and/or passive impedance(s) and other impedances may be large enough or require tight enough tolerances to warrant discrete components in many embodiments. In those cases, these components (e.g. filter capacitance 110) may be implemented with one or more discrete capacitors, resistors, inductors, and/or other discrete components.

Moreover, the total number of signal pins (e.g. those of ADCs and I/Os) required and the number of components can be even further reduced through use of time, frequency, encoding or other multiplexing technique.

Arranging the sensing electrodes 112A-B in any number of patterns also allows for many diverse types of sensor layouts (including multi-dimensional layouts found in touchpads capable of sensing in one, two or more-dimensions) to be formulated. Alternatively, multiple "button"-type touch sensors and combinations of button-type and touchpad-type input devices can be readily formed from the various channels, or any number of other sensor layouts could be created.

Figure 5:
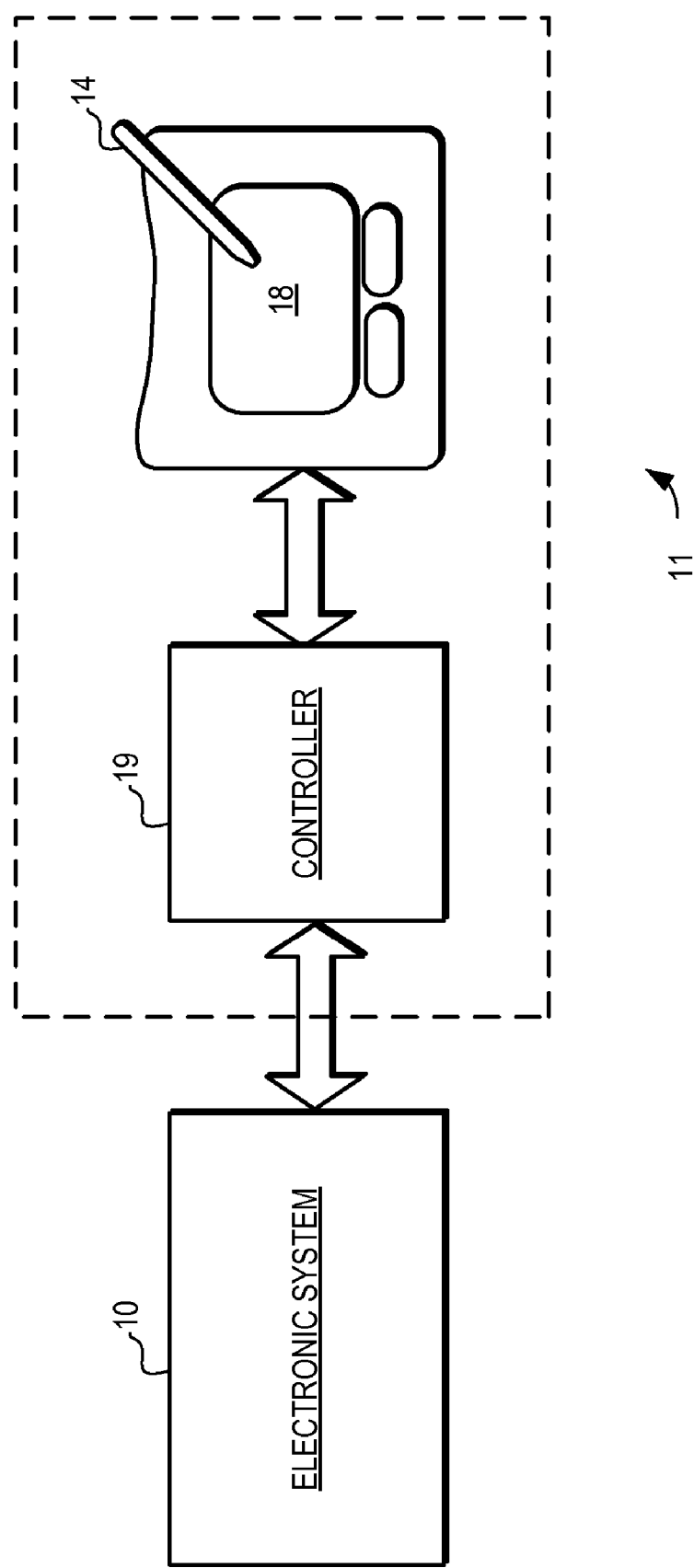
FIG. 5 is a schematic diagram of a proximity sensor device with an electronic system.

As stated above, the devices and methods for determining capacitance are particularly applicable for use in proximity sensor devices. Turning now to FIG. 5, a block diagram is illustrated of an exemplary electronic system 10 that is coupled to a proximity sensor device 11. Electronic system 10 is meant to represent any type of personal computer, portable computer, workstation, personal digital assistant, video game player, communication device (including wireless phones and messaging devices), media device, including recorders and players (including televisions, cable boxes, music players, and video players) or other device capable of accepting input from a user and of processing information. Accordingly, the various embodiments of system 10 may include any type of processor, memory or display. Additionally, the elements of system 10 may communicate via a bus, network or other wired or wireless interconnection. The proximity sensor device 11 can be connected to the system 10 through any type of interface or connection, including I2C, SPI, PS/2, Universal Serial Bus (USB), Bluetooth, RF, IRDA, or any other type of wired or wireless connection to list several non-limiting examples.

Proximity sensor device 11 includes a controller 19 and a sensing region 18. Proximity sensor device 11 is sensitive to the position of a stylus 114, finger and/or other input object within the sensing region 18 by measuring the resulting capacitance. "Sensing region" 18 as used herein is intended to broadly encompass any space above, around, in and/or near the proximity sensor device 11 wherein the sensor is able to detect a position of the object. In a conventional embodiment, sensing region 18 extends from the surface of the sensor in one or more directions for a distance into space until signal-to-noise ratios prevent object detection. This distance may be on the order of less than a millimeter, millimeters, centimeters, or more, and may vary significantly with the size of sensing electrodes, type of position sensing technology used, and the accuracy desired. Accordingly, the planarity, size, shape and exact locations of the particular sensing regions 18 will vary widely from embodiment to embodiment.

In operation, proximity sensor device 11 suitably detects a position of stylus 14 by measuring the measurable capacitance associated with the plurality of electrodes and finger or other input object within sensing region 18, and using controller 9, provides electrical or electronic indicia of the position to the electronic system 10. The system 10 appropriately processes the indicia to accept inputs from the user, to move a cursor or other object on a display, or for any other purpose.

In a common implementation of a touch sensor device a voltage is typically applied to create an electric field across a sensing surface. A capacitive proximity sensor device 11 would then detect the position of an object by detecting changes in capacitance caused by the changes in the electric field due to the object. For example, the sensor of proximity sensor device 11 can use arrays of capacitive sensing electrodes to support any number of sensing regions. As another example, the sensor can use capacitive sensing technology in combination with resistive sensing technology to support the same sensing region or different sensing regions. Depending on sensing technique used for detecting object motion, the size and shape of the sensing region, the desired performance, the expected operating conditions, and the like, proximity sensor device 11 can be implemented with a variety of different ways. The sensing technology can also vary in the type of information provided, such as to provide "one-dimensional" position information (e.g. along a sensing region) as a scalar, "two-dimensional" position information (e.g. horizontal/vertical axes, angular/radial, or any other axes that span the two dimensions) as a combination of values, and the like.

The controller 19, sometimes referred to as a proximity sensor processor or touch sensor controller, is coupled to the sensor and the electronic system 10. In general, the controller 19 measures the capacitance using any of the various techniques described above, and communicates with the electronic system. The controller 19 can perform a variety of additional processes on the signals received from the sensor to implement the proximity sensor device 11. For example, the controller 19 can select or connect individual sensing electrodes, detect presence/proximity, calculate position or motion information, and report a position or motion when a threshold is reached, and/or interpret and wait for a valid tap/stroke/character/button/gesture sequence before reporting it to the electronic system 10, or indicating it to the user. The controller 19 can also determine when certain types or combinations of object motions occur proximate the sensor.

In this specification, the term "controller" is defined to include one or more processing elements that are adapted to perform the recited operations. Thus, the controller 19 can comprise all or part of one or more integrated circuits, firmware code, and/or software code that receive electrical signals from the sensor, measure capacitance of the electrodes on the sensor, and communicate with the electronic system 10. In some embodiments, the elements that comprise the controller 19 would be located with or near the sensor. In other embodiments, some elements of the controller 19 would be with the sensor and other elements of the controller 19 would reside on or near the electronic system 100. In this embodiment minimal processing could be performed near the sensor, with the majority of the processing performed on the electronic system 10.

Again, as the term is used in this application, the term "electronic system" broadly refers to any type of device that communicates with proximity sensor device 11. The electronic system 10 could thus comprise any type of device or devices in which a touch sensor device can be implemented in or coupled to. The proximity sensor device could be implemented as part of the electronic system 10, or coupled to the electronic system using any suitable technique. As non-limiting examples the electronic system 10 could thus comprise any type of computing device, media player, communication device, or another input device (such as another touch sensor device or keypad). In some cases the electronic system 10 is itself a peripheral to a larger system. For example, the electronic system 10 could be a data input or output device, such as a remote control or display device, that communicates with a computer or media system (e.g., remote control for television) using a suitable wired or wireless technique. It should also be noted that the various elements (processor, memory, etc.) of the electronic system 10 could be implemented as part of an overall system, as part of the touch sensor device, or as a combination thereof. Additionally, the electronic system 10 could be a host or a slave to the proximity sensor device 11.

It should be noted that although the various embodiments described herein are referred to as "proximity sensor devices", "touch sensor devices", "proximity sensors", or "touch pads", these terms as used herein are intended to encompass not only conventional proximity sensor devices, but also a broad range of equivalent devices that are capable of detecting the position of a one or more fingers, pointers, styli and/or other objects. Such devices may include, without limitation, touch screens, touch pads, touch tablets, biometric authentication devices, handwriting or character recognition devices, and the like. Similarly, the terms "position" or "object position" as used herein are intended to broadly encompass absolute and relative positional information, and also other types of spatial-domain information such as velocity, acceleration, and the like, including measurement of motion in one or more directions. Various forms of positional information may also include time history components, as in the case of gesture recognition and the like. Accordingly, proximity sensor devices can appropriately detect more than the mere presence or absence of an object and may encompass a broad range of equivalents.

It should also be understood that while the embodiments of the invention are described herein the context of a fully functioning proximity sensor device, the mechanisms of the present invention are capable of being distributed as a program product in a variety of forms. For example, the mechanisms of the present invention can be implemented and distributed as a proximity sensor program on a computer-readable signal bearing media. Additionally, the embodiments of the present invention apply equally regardless of the particular type of signal bearing media used to carry out the distribution. Examples of signal bearing media include: recordable media such as memory cards, optical and magnetic disks, hard drives, and transmission media such as digital and analog communication links.

Various other modifications and enhancements may be performed on the structures and techniques set forth herein without departing from their basic teachings. Accordingly, there are provided numerous systems, devices and processes for detecting and/or quantifying one or more measurable capacitances. While at least one exemplary embodiment has been presented in the foregoing detailed description, it should be appreciated that a vast number of variations exist. The various steps of the techniques described herein, for example, may be practiced in any temporal order, and are not limited to the order presented and/or claimed herein. It should also be appreciated that the exemplary embodiments described herein are only examples, and are not intended to limit the scope, applicability, or configuration of the invention in any way. Various changes can therefore be made in the function and arrangement of elements without departing from the scope of the invention as set forth in the appended claims and the legal equivalents thereof.

What is claimed is:

1. A device for determining a measurable capacitance for proximity detection, the device comprising:
   a plurality of sensing electrodes;
   a guarding electrode proximate the plurality of sensing electrodes;
   a passive network that includes a filter capacitance; and
   a controller coupled to the plurality of sensing electrodes, the guarding electrode, and the passive network, the controller configured to apply a pre-determined voltage to at least one of the plurality of sensing electrodes using a first switch, apply a first guard voltage to the at least one guarding electrode using a second switch, share charge between at least one of the plurality of sensing electrodes and the passive network such that shared charge is accumulated on the filter capacitance, apply a second guard voltage different from the first guard voltage to the guarding electrode; and measure a voltage on the filter capacitance for a number of measurements equal to at least one to produce at least one result to determine the measurable capacitance for proximity detection.

2. The device of claim 1 wherein the plurality of sensing electrodes and the guarding electrode are formed as circuits of a printed circuit board.

3. The device of claim 1 wherein the first guard voltage comprises a voltage selected to approximate the predetermined voltage applied to the at least one of the plurality of sensing electrodes.

4. The device of claim 1 wherein the second guard voltage comprises a voltage selected to be in a range between and including a threshold voltage and a reset voltage.

5. The device of claim 1 wherein the second guard voltage comprises a variable voltage with a time constant selected to approximate voltage on the filter capacitance.

6. The device of claim 1 wherein the wherein the second guard voltage comprises a pulse modulated signal.

7. The device of claim 1 wherein the second guard voltage comprises a voltage approximating a predetermined average voltage on the filter capacitance.

8. The device of claim 1 wherein the plurality of electrodes includes at least one transmitting electrode and at least one receiving electrode, and wherein the measurable capacitance comprises a transcapacitance established between the at least one transmitting electrode and the at least one receiving electrode.

9. The device of claim 1 wherein the controller is further configured to share charge using a third switch.

10. The device of claim 1 wherein the controller is further configured to apply the second guard voltage using a third switch.

11. A device for measuring a capacitance value, the device comprising:
    a passive network coupled to a first capacitance, wherein the passive network is configured to store charge received from the first capacitance;
    a charge changing circuit coupled to the passive network;
    a guarding electrode proximate the first capacitance;
    a controller configured to measure the capacitance value by repeatedly applying a predetermined voltage to the first capacitance, repeatedly storing charge received from the first capacitance on the passive network, and repeatedly comparing a voltage on the passive network to a threshold of a quantizer and changing a charge on the passive network by a quantized amount of charge using the charge changing circuit in response to the voltage on the passive network being past the threshold of the quantizer, the quantized amount of charge determined at least in part as a function of an output of the quantizer; and
    wherein the controller is configured to apply a guarding signal to the guarding electrode, the guarding signal including at least a first guard voltage level and a second guard voltage level.

12. The device of claim 11 wherein the first capacitance is formed in part from a first of a plurality of sensing electrodes, and wherein the plurality of sensing electrodes and the guarding electrode are formed as circuits of a printed circuit board.

13. The device of claim 11 wherein the first guard voltage level comprises a voltage selected to approximate the predetermined voltage applied to the first capacitance.

14. The device of claim 11 wherein the second guard voltage level comprises a voltage selected to be outside of a range between and including a threshold voltage and the predetermined voltage.

15. The device of claim 11 wherein the wherein the second guard voltage comprises a pulse modulated signal.

16. The device of claim 11 wherein the second guard voltage comprises a voltage approximating a predetermined average voltage on the passive network.

17. The device of claim 11 wherein the second guard voltage level comprises a voltage approximating a threshold voltage of the quantizer.

18. A device for measuring a measurable capacitance, the device comprising:
- a filter capacitance;
- a passive impedance statically coupling the filter capacitance to the measurable capacitance;
- a guarding electrode proximate the measurable capacitance; and
- a controller coupled to the measurable capacitance, wherein the controller is configured to perform a charge transfer process, wherein the charge transfer process comprises applying a predetermined voltage to the measurable capacitance and allowing the measurable capacitance to share charge with the filter capacitance through the passive impedance, and wherein the controller is further configured to determine a value of the measurable capacitance as a function of an accumulated charge on the filter capacitance; and wherein the controller is configured to apply a guarding signal to the guarding electrode, the guarding signal including at least a first guard voltage level and a second guard voltage level.

19. The device of claim 18 wherein the measurable capacitance is formed in part from a first of a plurality of sensing electrodes, and wherein the plurality of sensing electrodes and the guarding electrode are formed as a circuit of a printed circuit board.

20. The device of claim 18 wherein the first guard voltage comprises a voltage selected to reduce the charge accumulated from the guarding electrode through the sensing electrode and onto the filter capacitance.

21. The device of claim 18 wherein the second guard voltage comprises a voltage selected to be in a range between and including a threshold voltage and a reset voltage.

22. The device of claim 18 wherein the second guard voltage comprises a variable voltage with a time constant selected to approximate voltage on the filter capacitance.

23. The device of claim 18 wherein the wherein the second guard voltage comprises a pulse modulated signal.

24. The device of claim 18 wherein the second guard voltage comprises a voltage approximating a predetermined average voltage on the filter capacitance.

25. The device of claim 18 wherein the controller is further configured to reset a voltage on the filter capacitance using a switch.

\* \* \* \* \*

UNITED STATES PATENT AND TRADEMARK OFFICE
CERTIFICATE OF CORRECTION

PATENT NO. : 7,521,942 B2
APPLICATION NO. : 11/926411
DATED : April 21, 2009
INVENTOR(S) : Joseph Kurth Reynolds Page 1 of 1

It is certified that error appears in the above-identified patent and that said Letters Patent is hereby corrected as shown below:

In Claim 6, column 32, line 29, delete the second instance of the words "wherein the"

In Claim 15, column 33, line 12, delete the second instance of the words "wherein the"

In Claim 23, column 34, line 24, delete the second instance of the words "wherein the"

Signed and Sealed this
Twenty-fifth Day of September, 2012

David J. Kappos
*Director of the United States Patent and Trademark Office*